US009593827B2

(12) United States Patent
Ji et al.

(10) Patent No.: US 9,593,827 B2
(45) Date of Patent: Mar. 14, 2017

(54) LIGHT SOURCE MODULE, LIGHTING DEVICE, AND LIGHTING SYSTEM

(71) Applicant: SAMSUNG ELECTRONICS CO., LTD., Suwon-si (KR)

(72) Inventors: Won Soo Ji, Hwaseong-si (KR); Hun Yong Park, Seoul (KR); Sang Woo Ha, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 14/602,554

(22) Filed: Jan. 22, 2015

(65) Prior Publication Data
US 2015/0354786 A1 Dec. 10, 2015

(30) Foreign Application Priority Data
Jun. 9, 2014 (KR) ........................ 10-2014-0069233

(51) Int. Cl.
*F21V 13/04* (2006.01)
*F21V 7/00* (2006.01)
(Continued)

(52) U.S. Cl.
CPC ................ *F21V 13/04* (2013.01); *F21V 5/04* (2013.01); *F21V 7/0066* (2013.01);
(Continued)

(58) Field of Classification Search
CPC .. E21B 36/04; E21B 43/243; E21B 47/02216; E21B 43/2401; B65D 21/062; B65D 21/066; H01Q 15/02; H01L 2224/48091; H01L 2924/00014; H01L 2924/00; H01L 2224/48465; H01L 33/20;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 2006-114863 A 4/2006
JP 2009-44016 A 2/2009
(Continued)

OTHER PUBLICATIONS

Communication dated Sep. 29, 2015 issued by the Japanese Patent Office in counterpart Japanese Patent Application No. 2015-053555.

*Primary Examiner* — Douglas W Owens
*Assistant Examiner* — Monica C King
(74) *Attorney, Agent, or Firm* — Sughrue Mion, PLLC

(57) ABSTRACT

A are provided a light source module. The light source module including a light emitting device configured to emit light in a light emitting direction; and an optical device including a first surface disposed over the light emitting device and having a groove recessed in the light emitting direction in a central portion through which an optical axis of the optical device passes, and a second surface disposed opposite to the first surface and configured to refract light incident through the groove to be emitted to the outside. The optical device includes a plurality of ridges disposed on the second surface and periodically arranged in a direction from the optical axis to an edge of the optical device connected to the first surface.

20 Claims, 20 Drawing Sheets

(51) Int. Cl.
*F21V 5/04* (2006.01)
*H05B 33/08* (2006.01)
*F21Y 101/02* (2006.01)

(52) U.S. Cl.
CPC ....... *H05B 33/086* (2013.01); *H05B 33/0872* (2013.01); *F21Y 2101/02* (2013.01)

(58) Field of Classification Search
CPC . H01L 2224/48247; H01L 2224/45139; H01L 2224/4848; H01L 33/22; H01L 33/24; H01L 33/62; H01L 33/38; H01L 33/405
See application file for complete search history.

(56) References Cited

U.S. PATENT DOCUMENTS

| | | | |
|---|---|---|---|
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |
| 6,967,353 B2 | | 11/2005 | Suzuki et al. |
| 7,002,182 B2 | | 2/2006 | Okuyama et al. |
| 7,084,420 B2 | | 8/2006 | Kim et al. |
| 7,087,932 B2 | | 8/2006 | Okuyama et al. |
| 7,154,124 B2 | | 12/2006 | Han et al. |
| 7,208,725 B2 | | 4/2007 | Sherrer et al. |
| 7,288,758 B2 | | 10/2007 | Sherrer et al. |
| 7,319,044 B2 | | 1/2008 | Han et al. |
| 7,501,656 B2 | | 3/2009 | Han et al. |
| 7,709,857 B2 | | 5/2010 | Kim et al. |
| 7,759,140 B2 | | 7/2010 | Lee et al. |
| 7,781,727 B2 | | 8/2010 | Sherrer et al. |
| 7,790,482 B2 | | 9/2010 | Han et al. |
| 7,940,350 B2 | | 5/2011 | Jeong |
| 7,959,312 B2 | | 6/2011 | Yoo et al. |
| 7,964,881 B2 | | 6/2011 | Choi et al. |
| 7,985,976 B2 | | 7/2011 | Choi et al. |
| 7,994,525 B2 | | 8/2011 | Lee et al. |
| 8,008,683 B2 | | 8/2011 | Choi et al. |
| 8,013,352 B2 | | 9/2011 | Lee et al. |
| 8,049,161 B2 | | 11/2011 | Sherrer et al. |
| 8,129,711 B2 | | 3/2012 | Kang et al. |
| 8,179,938 B2 | | 5/2012 | Kim |
| 8,253,154 B2 | | 8/2012 | Jung et al. |
| 8,263,987 B2 | | 9/2012 | Choi et al. |
| 8,324,646 B2 | | 12/2012 | Lee et al. |
| 8,399,944 B2 | | 3/2013 | Kwak et al. |
| 8,432,511 B2 | | 4/2013 | Jeong |
| 8,459,832 B2 | | 6/2013 | Kim |
| 8,502,242 B2 | | 8/2013 | Kim |
| 8,536,604 B2 | | 9/2013 | Kwak et al. |
| 8,735,931 B2 | | 5/2014 | Han et al. |
| 8,766,295 B2 | | 7/2014 | Kim |
| 2006/0066218 A1 | | 3/2006 | Yamaguchi et al. |
| 2006/0083000 A1 | | 4/2006 | Yoon et al. |
| 2009/0052192 A1 | | 2/2009 | Kokubo et al. |
| 2010/0270907 A1 | | 10/2010 | Yamaguchi et al. |
| 2010/0283065 A1 | | 11/2010 | Yen |
| 2011/0114979 A1 | | 5/2011 | Jang |
| 2011/0210368 A1 | | 9/2011 | Jeong et al. |

FOREIGN PATENT DOCUMENTS

| | | |
|---|---|---|
| JP | 2009-241369 A | 10/2009 |
| JP | 2009-258143 A | 11/2009 |
| JP | 3156731 U | 1/2010 |
| JP | 2011-91022 A | 5/2011 |
| JP | 2011-109102 A | 6/2011 |
| JP | 2012-123984 A | 6/2012 |
| KR | 10-2008-0067154 A | 7/2008 |
| KR | 10-1018331 B1 | 3/2011 |
| KR | 10-2011-0130847 A | 12/2011 |
| KR | 10-2011-0138966 A | 12/2011 |
| KR | 10-2012-0111531 A | 10/2012 |
| KR | 10-2013-0116682 A | 10/2013 |

FIG. 13

LIGHT SOURCE MODULE, LIGHTING DEVICE, AND LIGHTING SYSTEM

CROSS-REFERENCE TO RELATED APPLICATION

This application claims priority from Korean Patent Application No. 10-2014-0069233 filed on Jun. 9, 2014, with the Korean Intellectual Property Office, the disclosure of which is incorporated herein by reference.

BACKGROUND

1. Field

Apparatuses and systems consistent with the present disclosure relate to a light source module, a lighting device, and a lighting system.

2. Description of Related Art

Commonly, lenses for light emitting diodes (LEDs) are fabricated using a plastic injection molding method in order to reduce costs. That is, a mold is fabricated with reference to an optical blueprint, and lenses are mass-produced using the mold. Such lenses fabricated through such a plastic injection molding method may have a lower degree of precision than processed glass lenses. However, recently, with an increase in demand for slimness, greater precision in the machining of lenses has been required. In particular, since lens performance is determined by conditions of a microscopic injection molding process due to the trend for the slimness thereof, differences in performance may appear according to the conditions of injection molding processes, even when the same mold is used. In addition, even when individual lenses have slight differences in terms of performance, optical uniformity failures, such as mura defects, may appear in lighting devices or display apparatuses due to the properties of individual lenses when a plurality of lenses are assembled and arranged.

SUMMARY

Exemplary embodiments provide a light source module, a lighting device, and a lighting system capable of preventing the generation of mura defects and having uniform light distribution.

According to an aspect of an exemplary embodiment, there is provided a light source module including a light emitting device that is configured to emit light in a light emitting direction; and an optical device comprising a first surface disposed over the light emitting device and having a groove recessed in the light emitting direction in a central portion through which an optical axis of the optical device passes, and a second surface disposed to be opposite to the first surface and configured to refract light incident through the groove to be emitted to the outside, wherein the optical device includes a plurality of ridges disposed on the second surface and periodically arranged in a direction from the optical axis to an edge of the optical device connected to the first surface.

The plurality of ridges are arranged to form respective concentric circles around the optical axis.

The plurality of ridges may be arranged in spirals around the optical axis.

A pitch of the plurality of ridges may be about 0.01 mm to about 0.04 mm.

The second surface convexly may protrude in the light emitting direction, and have an inflection point at which a central area through which the optical axis passes is concavely recessed toward the groove.

The second surface may have a concave portion having a concavely curved surface recessed toward the groove along the optical axis, and a convex portion having a convexly curved surface extending continuously from an edge of the concave portion to the edge of the optical device.

The groove may be disposed to face the light emitting device above the light emitting device.

The groove may have a larger cross-sectional area exposed on the first surface than a cross-sectional area of a light emitting surface of the light emitting device.

The optical device may be disposed above the light emitting surface such that the first surface faces the light emitting device and is located on a same plane as an upper surface of the light emitting device.

The first surface may further include a reflection groove configured to re-reflect light that is totally reflected by the second surface and directed back toward the first surface among light emitted from the light emitting device, and emit the re-reflected light to the outside through the second surface.

The reflection groove may be formed in a ring between the groove of the central area and an edge of the first surface and form a rotational symmetry with respect to the optical axis Z.

The reflection groove may have a peak that is located at a position lower than a peak of the groove in the light emitting direction, and the reflection groove may include an inclined surface connecting the peak to the first surface, and a reflective surface connecting the peak to the edge of the optical device.

The reflective surface may have a gently curved surface.

The first surface my further include a support configured to support the optical device.

According to an aspect of another exemplary embodiment, there is provided a lighting device including a housing having an electrical connection structure; and at least one light source module mounted on the housing and electrically connected to the electrical connection structure, wherein the at least one light source module is the light source module.

The lighting device may further include a cover mounted on the housing and configured to cover the at least one light source module.

According to an aspect of another exemplary embodiment, there is provided a lighting system comprising a sensor that is configured to measure at least one of a temperature and a humidity of an environment; a controller that is configured to compare the at least one of the temperature and the humidity measured by the sensor with a set value; a lighting module comprising at least one lighting device; and a driver that supplies power to the sensor, the controller, and the lighting module, wherein the controller is further configured to determine a color temperature of the lighting module based on a comparison result, and control the lighting module based on the color temperature.

The at least one lighting device may include a housing having an electrical connection structure, and at least one light source module mounted on the housing, and the at least one light source module may include a light emitting device that is configured to emit light in a light emitting direction; and an optical device including a first surface disposed over the light emitting device and having a groove recessed in the light emitting direction in a central portion through which an optical axis of the optical device passes, and a second surface disposed to be opposite to the first surface and configured to refract light incident through the groove to be emitted to the outside, wherein the optical device includes a plurality of ridges disposed on the second surface and periodically arranged in a direction from the optical axis to an edge connected to the first surface.

The plurality of ridges may be arranged to form respective concentric circles around the optical axis.

The at least one lighting device may include a first lighting device emitting a first light having a first color temperature, and a second lighting device emitting a second light having a second color temperature, and wherein the controller may be configured to control the first lighting device and the second lighting device to mix the first light and the second light to generate light having the determined color temperature based on the first color temperature and the second color temperature.

According to an aspect of another exemplary embodiment, there is provided a light source module including a light emitting device comprising an optical axis along which light is emitted; and an optical device that refracts light emitted from the light emitting device and has an optical axis aligned with the optical axis of the light emitting device, the optical device including: a first surface including a groove recessed along the optical access of the optical device, the groove receiving the light from the light emitting device; and a second surface including a plurality of ridges arranged in a radial direction from the optical axis that refract light incident through the groove.

The groove may be recessed in a central portion of the first surface through which the optical axis of the optical device passes.

The plurality of ridges may be arranged to form respective concentric circles around the optical axis.

The plurality of ridges may be arranged in spirals around the optical axis.

A pitch of the ridges may be about 0.01 mm to about 0.04 mm.

The groove may have a larger cross-sectional area exposed on the first surface than a cross-sectional area of a light emitting surface of the light emitting device.

The first surface may further include a reflection groove configured to reflect light that has been reflected by the second surface and directed back toward the first surface, toward the outside of the optical device.

The second surface may be a convex surface having a concave portion recessed toward the groove and having an inflection point on the optical axis of the optical device.

BRIEF DESCRIPTION OF DRAWINGS

The above and/or other aspects will be more clearly understood from the following detailed description of exemplary embodiment taken in conjunction with the accompanying drawings, in which:

FIG. 13 is a photograph experimentally showing optical characteristics according to a type of a tool and a processing pitch;

DETAILED DESCRIPTION

Figure 1:
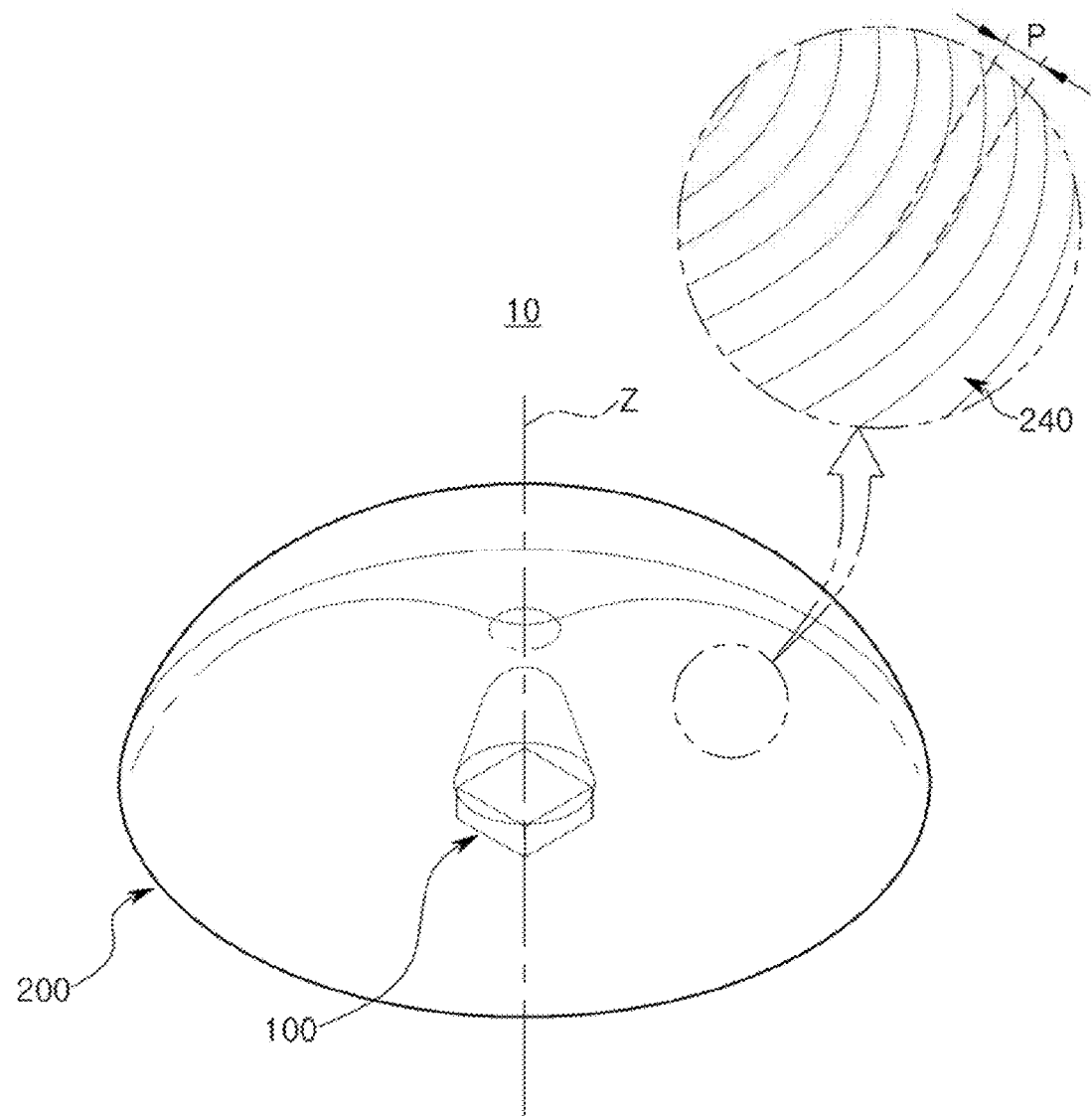
FIG. 1 is a perspective view schematically illustrating a light source module according to an exemplary embodiment.

Hereinafter, exemplary embodiments will be described in detail with reference to the accompanying drawings.

The inventive concept may, however, be exemplified in many different forms and should not be construed as being limited to the specific exemplary embodiments set forth herein. In the drawings, the shapes and dimensions of elements may be exaggerated for clarity, and the same reference numerals will be used throughout to designate the same or like elements. Throughout this disclosure, directional terms such as "upper," "upper (portion)," "upper surface," "lower," "lower (portion)," "lower surface," or "side surface" may be used herein to describe the relationship of one element or feature to another, as illustrated in the drawings. It will be understood that such descriptions are intended to encompass different orientations in use or operation in addition to orientations depicted in the drawings.

Figure 2:
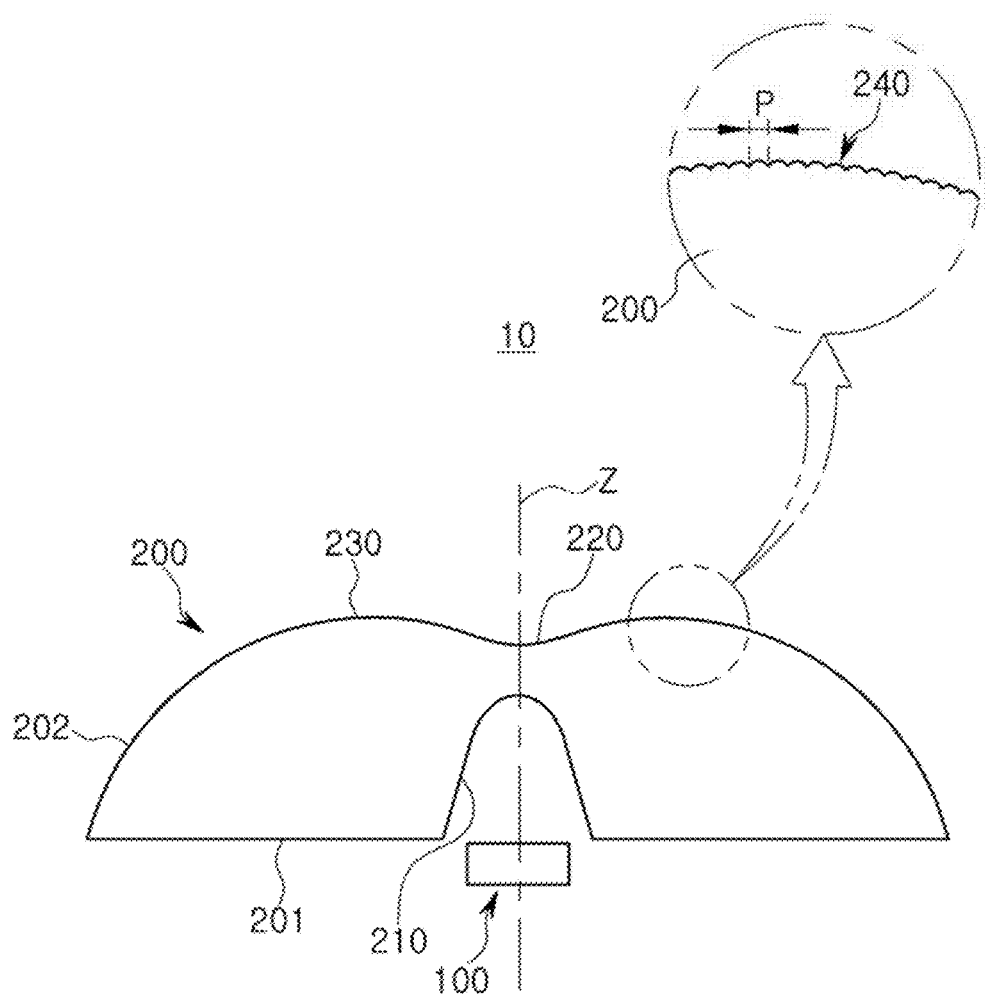
FIG. 2 is a cross-sectional view of the light source module illustrated in FIG. 1.

FIG. 1 is a perspective view schematically illustrating a light source module according to exemplary, and FIG. 2 is a cross-sectional view of the light source module illustrated in FIG. 1.

As illustrated in FIGS. 1 and 2, a light source module 10 according to exemplary may include a light emitting device 100, and an optical device 200 disposed on the light emitting device 100.

The light emitting device 100 may be a photoelectric device generating light having a wavelength using externally supplied driving power. The wavelength may be predetermined. For example, the light emitting device 100 may include a semiconductor light emitting diode (LED) chip having an n-type semiconductor layer, a p-type semiconductor layer, and an active layer disposed therebetween, and a package including the semiconductor LED chip.

The light emitting device 100 may emit blue light, green light, or red light in accordance with a containing material or a combination with a fluorescent material, or may emit white light, ultraviolet light, and the like.

As the light emitting device 100, various structures of LED chips or various types of LED packages including the LED chips thereinside may be used. Specific configuration and structure of the light emitting device 100 will be described later.

The optical device 200 may be disposed on the light emitting device 100 and control a beam angle of light emitted from the light emitting device 100 to the outside. The optical device 200 may include a wide beam angle lens spreading light to implement a wide beam angle.

The optical device 200 may include a first surface 201 disposed on the light emitting device 100, and a second surface 202 disposed opposite to the first surface 201 and refracting light of the light emitting device 100 to be emitted to the outside. In addition, the optical device 200 may be disposed above the light emitting device 100 in such a manner that the first surface 201 faces the light emitting device 100 and is located at least at the same level as an upper surface of the light emitting device 100. However, according to other exemplary embodiments, the first surface 201 may be disposed to be higher or lower than the upper surface of the light emitting device 100.

The first surface 201 may face the light emitting device 100, correspond to a bottom surface of the optical device 200, and have a flat circular-shaped cross-sectional structure overall. A groove 210 recessed in a light emitting direction may be disposed in the center of the first surface 201 through which an optical axis Z passes.

The groove 210 may have a structure rotationally symmetric with respect to the optical axis Z passing through the center of the optical device 200, and the surface of the groove 210 may be defined as a plane of incidence on which light of the light emitting device 100 is incident. Accordingly, the light generated in the light emitting device 100 passes through the groove 210 to proceed to the inside of the optical device 200.

The groove 210 may have a larger cross-sectional area exposed to the first surface 201 than a cross-sectional area of a light emitting surface of the light emitting device 100. In addition, the groove 210 may be disposed to face the light emitting device 100 above the light emitting device 100 in a form of covering the light emitting device 100.

The second surface 202 is a light emitting surface in which light that has entered the optical device 200 through the groove 210 is emitted to the outside, and corresponds to an upper surface of the optical device 200. The second surface 202 may be bulged upwardly overall in the form of a dome from an edge connected to the first surface 201, and a central portion through which the optical axis Z passes may be concavely recessed toward the groove 210 to have an inflection point.

In detail, the second surface 202 may include a concave portion 220 recessed toward the groove 210 along the optical axis Z to have a concavely curved surface, and a convex portion 230 extending continuously from an edge of the concave portion 220 to the edge of the optical device 200 to have a convexly curved surface.

A plurality of ridges 240 may be periodically arranged on the second surface 202 in a direction from the optical axis Z to an edge of the optical device 200 connected to the first surface 201.

Figure 3:
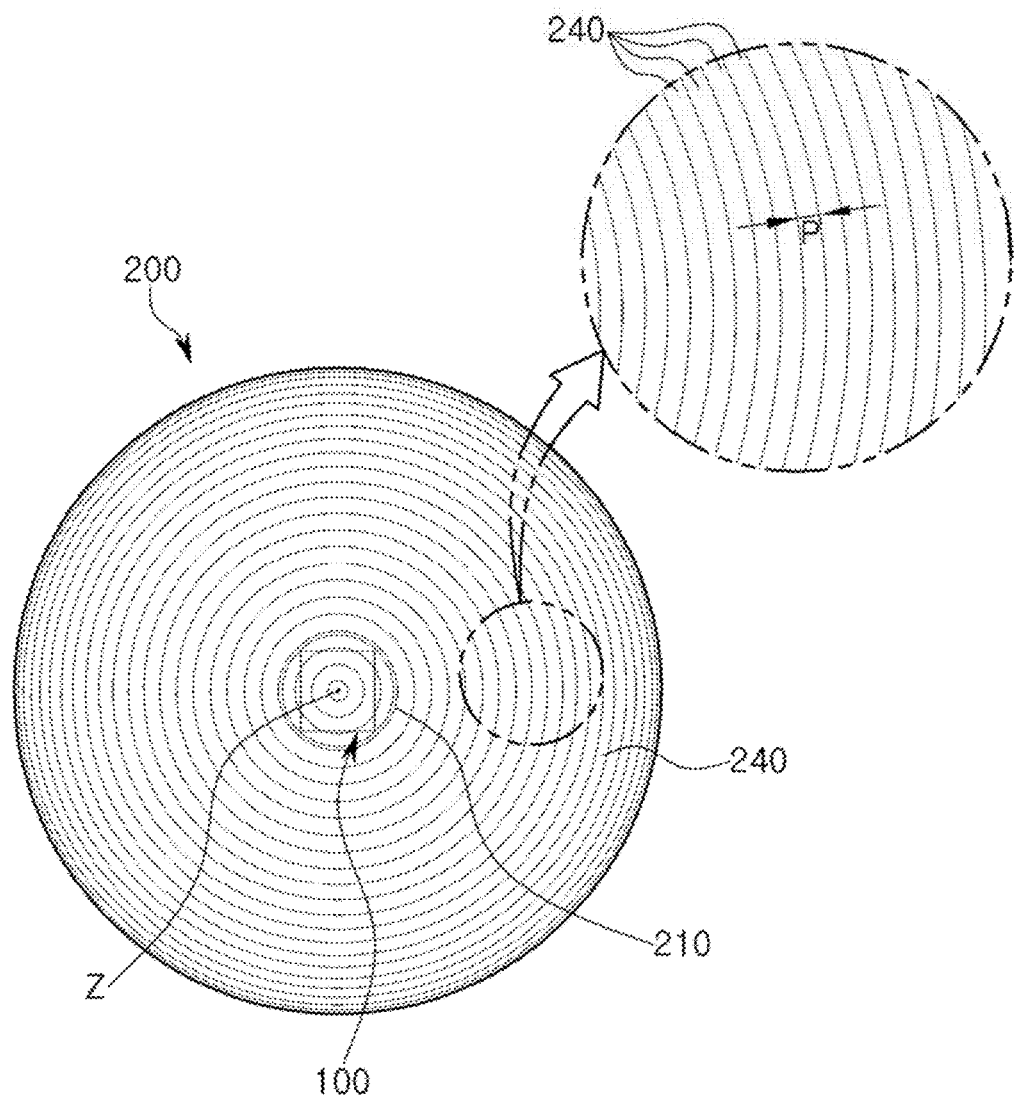
FIG. 3 is a plan view illustrating an example of an optical device included in the light source module illustrated in FIG. 1.

FIG. 3 is a plan view illustrating an example of an optical device included in the light source module illustrated in FIG. 1. As illustrated in FIG. 3, each of the plurality of ridges 240 may have a ring shape corresponding to a horizontal cross-sectional shape of the optical device 200, and form a concentric circle around the optical axis Z. In addition, the plurality of ridges 240 may be arranged in a structure that the ridges 240 radially spread out along surfaces of the concave portion 220 and convex portion 230 of the second surface 202 with the optical axis Z as a center.

Figure 4:
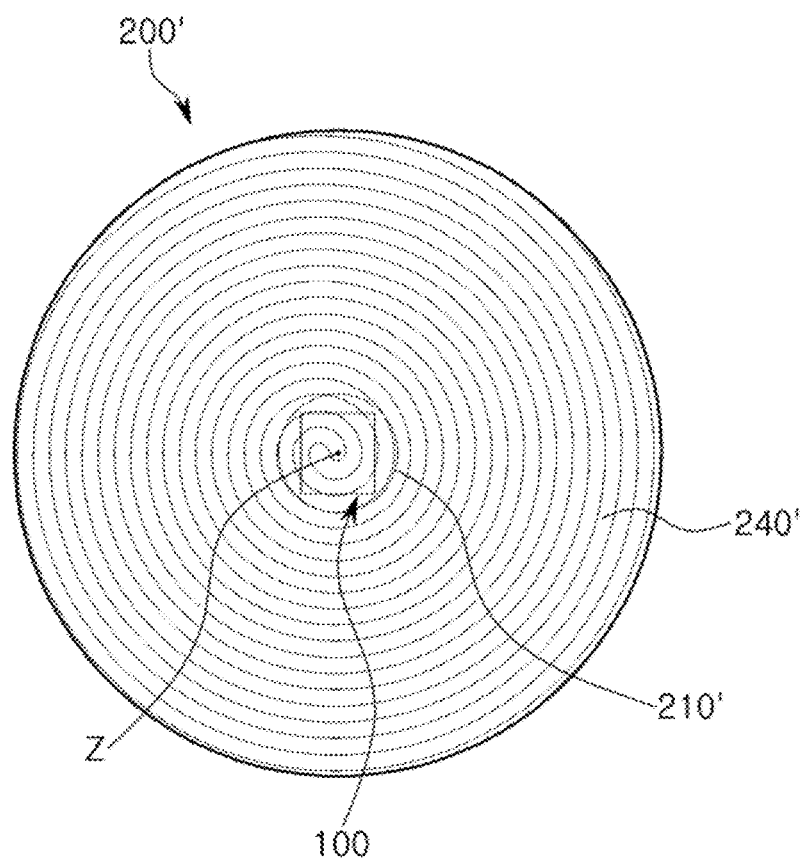
FIG. 4 is a plan view illustrating another example of an optical device included in the light source module illustrated in FIG. 1.

Meanwhile, FIG. 4 is a plan view illustrating another example of an optical device included in the light source module illustrated in FIG. 1. As illustrated in FIG. 4, a plurality of ridges 240' included in an optical device 200' may have a helix or coil structure extending continuously toward an edge of the optical device 200', with an optical axis Z as a center. The reference numeral 210' may denote a groove.

The plurality of ridges 240 may be spaced a certain pitch P apart to form a pattern. In this case, the pitch P between the plurality of ridges 240 may be in the range of about 0.01 mm to about 0.04 mm.

The plurality of ridges 240 may compensate for the difference in performance between the optical devices 200 due to microscopic machining errors generated in a process of fabricating the optical devices 200. Accordingly, the uniformity of light distribution may be improved, and the occurrence of mura defects may be prevented.

Figure 5:
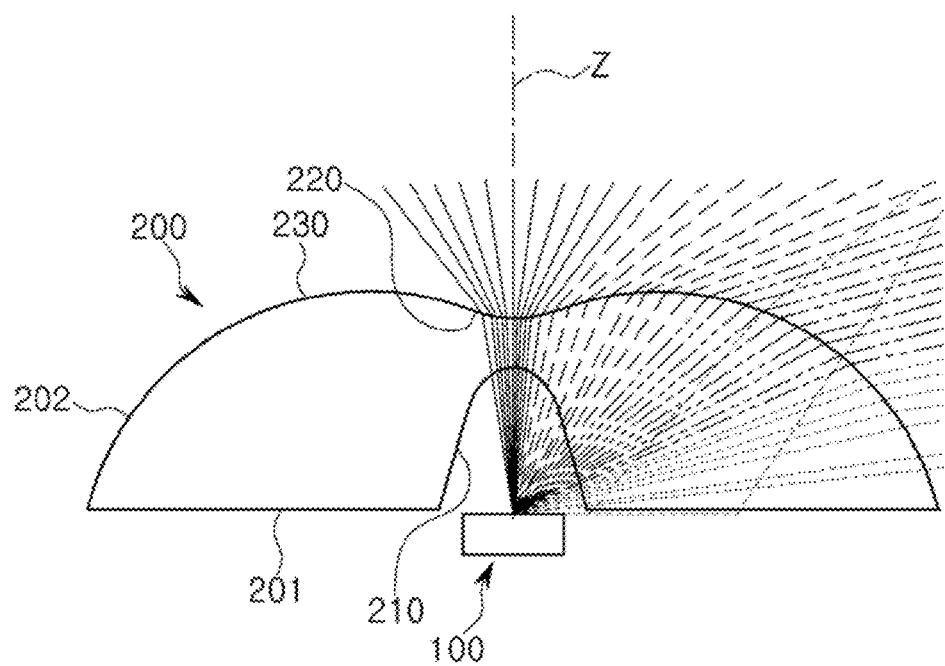
FIG. 5 is a cross-sectional view schematically illustrating a path of light in the light source module of FIG. 2.
Figure 6:
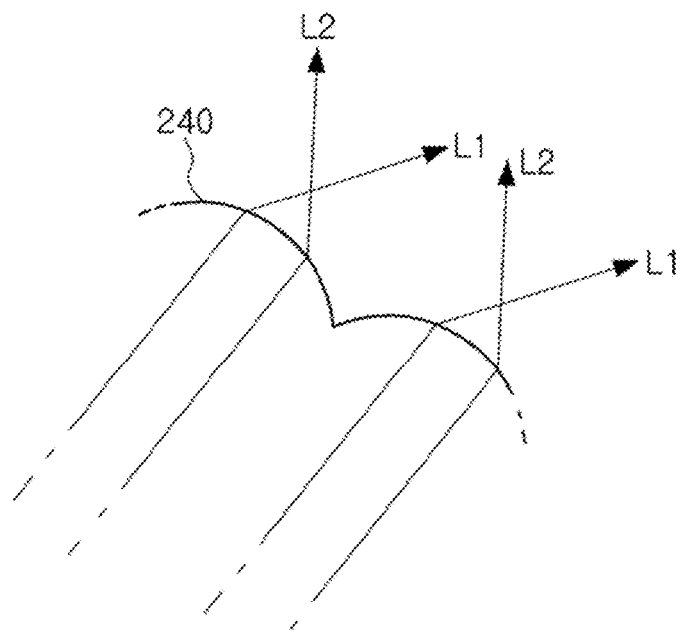
FIG. 6 is a cross-sectional view schematically illustrating a path of light passing through ridges.

FIG. 5 schematically illustrates a path of light passing through the optical device in the light source module. In addition, FIG. 6 schematically illustrates a path of light passing through the ridges 240 of the second surface to be emitted to the outside. As illustrated in FIGS. 5 and 6, light of the light emitting device 100 proceeds to the inside of the optical device 200 through the groove 210 of the optical device 200 and is refracted in the second surface 202 of the optical device 200, to implement a light distribution widely spreading in a lateral direction of the optical device 200. In particular, portions L1 of light passing through the ridges 240 may be refracted in a lateral direction of the optical device 200, and other portions L2 of light passing through the ridges 240 may be refracted in a direction of the optical axis direction due to structural characteristics of the ridges 240. That is, since light L1 and L2 passing through the same plane implements a distribution of light refracted in different directions in a microscopic view, a uniform distribution of light may be obtained throughout the whole light emitting surface, that is, the second surface 202 in a macroscopic view. By contrast, in a case in which ridges 240 are not provided, light passing through the second surface 202 may implement a distribution of light refracted in a specific direction, that is, only in a lateral direction, and therefore when a design error in the optical device occurs, a biased distribution of light and a poor uniformity of light may occur.

Figure 7:
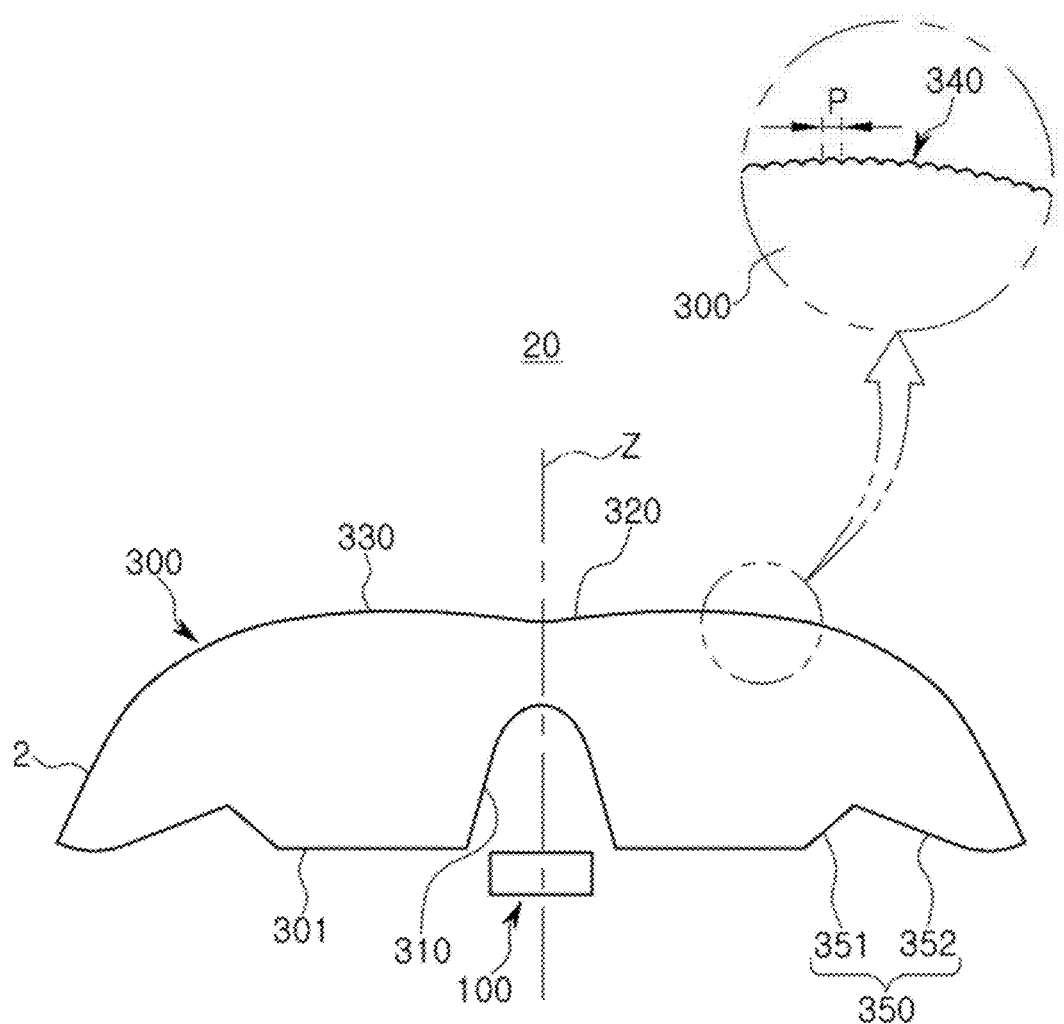
FIG. 7 is a cross-sectional view schematically illustrating a light source module according to another exemplary embodiment.

FIG. 7 schematically illustrates a light source module according to another exemplary embodiment. The light source module illustrated in FIG. 7 substantially has the same basic structure as the light source module according to the exemplary embodiment illustrated in FIGS. 1 and 2, with the exception of the structure of the optical device. Accordingly, since a structure of the optical device is different from the structure of the optical device according to the exemplary embodiment illustrated in FIGS. 1 and 2, detailed descriptions of the same components will be omitted and the configuration of the optical device will be mainly described hereinafter.

As illustrated in FIG. 7, a light source module 20 may include a light emitting device 100 and an optical device 300 disposed on the light emitting device 100.

The light emitting device 100 may be a photoelectric device generating light having a wavelength by a driving power applied from the outside. The wavelength may be predetermined. For example, the light emitting device 100 may include a semiconductor LED having an n-type semiconductor layer, a p-type semiconductor layer, and an active layer disposed therebetween.

As the light emitting device 100, various structures of LED chips or various types of LED packages including the LED chip thereinside may be used. Specific configuration and structure of the light emitting device 100 will be described later.

The optical device 300 may include a first surface 301 disposed on the light emitting device 100, and a second surface 302 disposed opposite to the first surface 301. In addition, the optical device 300 may be disposed above the light emitting device 100 in such a manner that the first surface 301 faces the light emitting device 100 and is located at least at the same level as an upper surface of the light emitting device 100.

The first surface 301 may face the light emitting device 100, correspond to a bottom surface of the optical device 300, and have a flat circular-shaped cross-section overall. A groove 310 recessed upward along an optical axis Z of the optical device 300 may be disposed in the center of the first surface 301.

The groove 310 may have a structure rotationally symmetric with respect to the optical axis Z passing through the center of the optical device 300, and the surface of the groove 310 may be defined as a plane of incidence on which light of the light emitting device 100 is incident. Accordingly, the light generated in the light emitting device 100 passes through the groove 310 to proceed to the inside of the optical device 300.

The groove 310 may have a larger cross-sectional area exposed to the first surface 301 than a cross-sectional area of a light emitting surface of the light emitting device 100. In addition, the groove 310 may be disposed to face the light emitting device 100 above the light emitting device 100 in a form of covering the light emitting device 100.

A reflection groove 350 may be disposed on the first surface 301. The reflection groove 350 may re-reflect light, totally reflected on the second surface 302 and proceeding to the first surface 301, among light emitted from the light emitting device 100, and emit the re-reflected light to the outside through the second surface 302.

The reflection groove 350 may be rotationally symmetric with respect to the optical axis Z, and may be disposed in the form of a ring surrounding the groove 310 disposed in the center, in the vicinity of an edge of the first surface 301.

The reflection groove 350 may be formed to have a peak located in a position lower than a peak of the groove 310, and may include an inclined surface 351 connecting the peak to the first surface 301, and a reflective surface 352 connecting the peak to an edge of the optical device 300.

The inclined surface 351 may be inclined from the peak of the reflection groove 350 toward the groove 310. The reflective surface 352 may extend from the peak toward the edge of the optical device 300 and have a gently curved surface.

The second surface 302 is a light emitting surface in which light that has entered the optical device 300 through the groove 310 is emitted to the outside, and corresponds to an upper surface of the optical device 300. The second surface 302 may be bulged upwardly overall in the form of a dome from the edge of the optical device 300 connected to the first surface 301, and a central portion through which the optical axis Z passes is concavely recessed toward the groove 310 to have an inflection point.

In detail, the second surface 302 may include a concave portion 320 recessed toward the groove 310 along the optical axis Z to have a concavely curved surface, and a convex portion 330 extending continuously from an edge of the concave portion 320 to the edge of the optical device 300 to have a convexly curved surface.

A plurality of ridges 340 may be periodically arranged on the second surface 302 in a direction from the optical axis Z to the edge of the optical device 300. Each of the plurality of ridges 340 may have a ring shape corresponding to a horizontal cross-sectional shape of the optical device 300, and form a concentric circle around the optical axis Z. In addition, the plurality of ridges 340 may be formed to be arranged on the concave portion 320 and convex portion 330 of the second surface 302.

The plurality of ridges 340 may be spaced a certain pitch P apart to form a pattern. In this case, the pitch P between the plurality of ridges 340 may be in the range of about 0.01 mm to about 0.04 mm.

Figures 8, 9A:
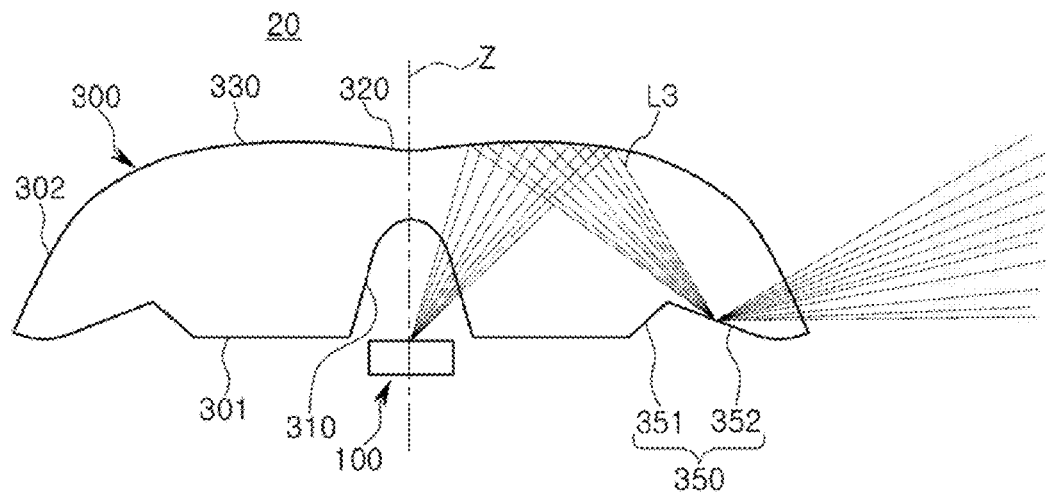
FIG. 8 is a cross-sectional view schematically illustrating a path of light in the light source module illustrated in FIG. 7.
FIGS. 9A and 9B are cross-sectional views schematically illustrating different respective light source modules according to exemplary embodiments.

FIG. 8 schematically illustrates a path of light in the light source module illustrated in FIG. 7. Although optical devices such as a lens enable light to uniformly spread from the center by using refraction, light may be lost when some refractive conditions are not satisfied. These refractive conditions may be determined by an angle formed by light proceeding to the air from the optical device 300 with the boundary surface between the air and the optical device 300, that is, the light emitting surface of the optical device 300, that is, the second surface 302.

According to the structure of the optical device 300, in some cases, light may be reflected back to the inside without being transmitted to the outside in some areas of the second surface 302. Light lost without proceeding to the outside of the optical device 300 due to the total reflection may cause degradation of luminous efficiency of the light source module 20, and degradation of brightness and poor optical uniformity in lighting devices or display apparatuses.

As illustrated in FIG. 8, the optical device 300 may re-reflect light L3 that is totally reflected by the second surface 302 and that proceeds back toward the first surface 301, on the reflective surface 352, and emit the re-reflected light to the outside through the second surface 302. Thus, loss of light may be prevented, and luminous efficiency may be improved.

FIG. 9A schematically illustrates a light source module according to another exemplary embodiment. The light source module according to the exemplary embodiment illustrated in FIG. 9A substantially has the same basic structure as the light source modules according to the exemplary embodiments illustrated in FIGS. 1 to 7, except that a support may be provided Accordingly, detailed descriptions of the same components will be omitted and the configuration of the optical device will be mainly described hereinafter.

As illustrated in FIG. 9A, a light source module 30 may include a light emitting device 100 and an optical device 400 disposed on the light emitting device 100.

The optical device 400 may include a first surface 401 on which light is incident from the light emitting device 100, and a second surface 402 emitting the light incident from the light emitting device 100 through the first surface 401. In addition, the optical device 400 may be disposed above the light emitting device 100 in such a manner than the first surface 401 faces the light emitting device 100 and is located at least at the same level as an upper surface of the light emitting device 100.

The first surface 401 may face the light emitting device 100, correspond to a bottom surface of the optical device 400, and have a flat circular-shaped cross-section overall. A groove 410 recessed upward along an optical axis Z of the optical device 400 may be disposed in the center of the first surface 401.

The groove 410 may have a rotationally symmetric structure with respect to the optical axis Z passing through the center of the optical device 400, and the surface of the groove 410 may be defined as a plane of incidence on which light of the light emitting device 100 is incident. Accordingly, the light generated in the light emitting device 100 passes through the groove 410 to proceed to the inside of the optical device 400.

The first surface 401 may further include a support 460 supporting the optical device 400 so as to be disposed above the light emitting device 100. The support 460 may be configured in the form of a ring provided on the first surface 401 between the groove 410 and the outer edge of the first surface 401. Alternatively, a plurality of supports 460 may be arranged as rings spaced apart from each other along the first surface 401. Moreover, alternatively, the plurality of supports 460 may provided as a plurality of individual, discrete supports and be arranged spaced apart from each other in the radial and/or axial directions.

When the light emitting device 100 is mounted on, for example, a circuit board, the optical device 400 may be mounted by the supports 460 in such a manner that the first surface 401 faces the light emitting device 100.

A plurality of ridges 440 may be periodically arranged in a direction from the optical axis Z to an edge of the optical device 400 in the second surface 402. Each of the plurality of ridges 440 may have a ring shape corresponding to a horizontal cross-sectional shape of the optical device 400, may form a concentric circle around the optical axis Z, and may be arranged on a concave portion 420 and a convex portion 430 of the second surface 402.

The plurality of ridges 440 may be spaced a certain pitch P apart to form a pattern. In this case, the pitch P between the plurality of ridges 440 may be in the range of about 0.01 mm to about 0.04 mm.

Figure 9B:
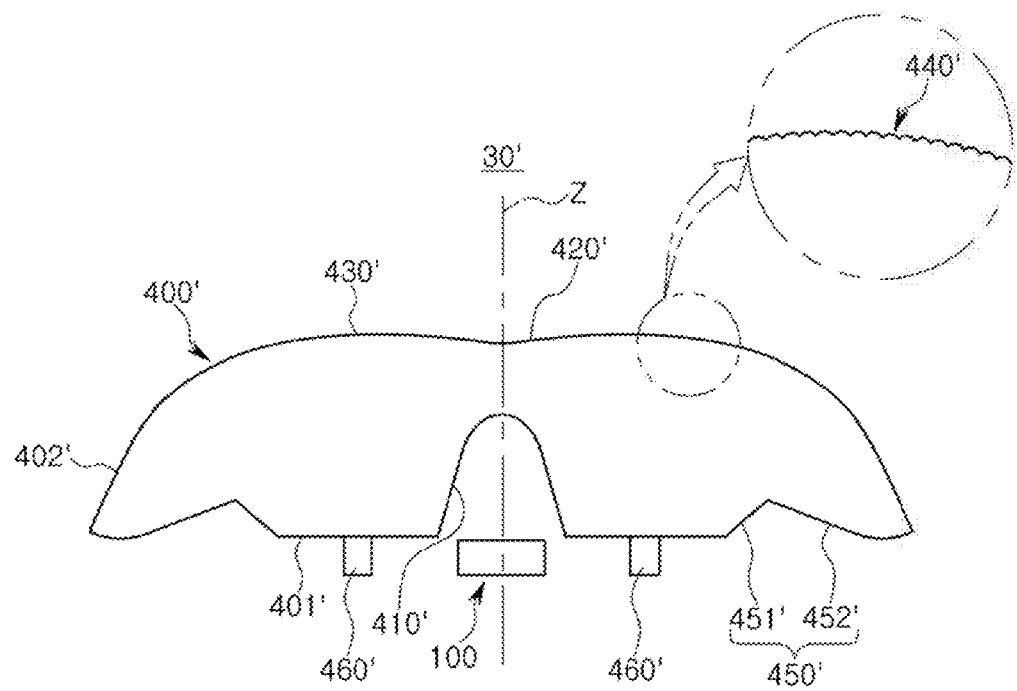

FIG. 9B schematically illustrates a light source module according to another exemplary embodiment. The light source module according to the exemplary embodiment illustrated in FIG. 9B substantially has the same basic structure as the light source module according to the exemplary embodiment illustrated in FIG. 8, except that a support is provided. Accordingly, detailed descriptions of the same components will be omitted and the configuration of the optical device will be mainly described hereinafter.

As illustrated in FIG. 9B, a light source module 30' may include a light emitting device 100 and an optical device 400' disposed on the light emitting device 100.

The optical device 400' may include a first surface 401' on which light is incident from the light emitting device 100, and a second surface 402' emitting the light incident from the light emitting device 100 through the first surface 401'. In addition, the optical device 400' may be disposed above the light emitting device 100 in such a manner than the first surface 401' faces the light emitting device 100 and is located at least at the same level as an upper surface of the light emitting device 100.

The first surface 401' may face the light emitting device 100, correspond to a bottom surface of the optical device 400', and have a flat circular-shaped cross-section overall. A groove 410' recessed upward along an optical axis Z of the optical device 400 may be disposed in the center of the first surface 401'.

The groove 410' may have a rotationally symmetric structure with respect to the optical axis Z passing through the center of the optical device 400', and the surface of the groove 410' may be defined as a plane of incidence on which light of the light emitting device 100 is incident. Accordingly, the light generated in the light emitting device 100 passes through the groove 410' to proceed to the inside of the optical device 400'.

As illustrated in FIG. 9B, the first surface 401' may include a reflection groove 450' which re-reflects light that is totally reflected by the second surface 402' and that proceeds toward the first surface 401', among light emitted by the light emitting device 100, and emit the re-reflected light to the outside through the second surface 402'.

The reflection groove 450' may be rotationally symmetric with respect to the optical axis Z, and may be disposed in the form of surrounding the groove 410' disposed in the center, in the vicinity of an edge of the first surface 401'.

The first surface 401' may further include a support 460' supporting the optical device 400' so as to be disposed above the light emitting device 100. The support 460' may be configured in the form of a ring provided on the first surface 401' between the groove 410' and the outer edge of the first surface 401'. Alternatively, a plurality of supports 460' may be arranged as rings spaced apart from each other along the first surface 401'. Moreover, alternatively, the plurality of supports 460' may provided as a plurality of individual, discrete supports 460' and be arranged spaced apart from each other in the radial and/or axial directions.

A plurality of ridges 440' may be periodically arranged in a direction from the optical axis Z to an edge of the optical device 400' in the second surface 402'. Each of the plurality of ridges 440' may have a ring shape corresponding to a horizontal cross-sectional shape of the optical device 400', may form a concentric circle around the optical axis Z, and may be arranged on a concave portion 420' and a convex portion 430' of the second surface 402'.

The plurality of ridges 440' may be spaced a certain pitch P apart to form a pattern. In this case, the pitch P between the plurality of ridges 440' may be in the range of about 0.01 mm to about 0.04 mm.

The optical devices 200, 300, 400, and 400' may be formed of a resin material having translucency, for example, polycarbonate (PC), polymethylmethacrylate (PMMA), acrylic. In addition, the optical devices 200, 300, 400, and 400' may be formed of a glass material, but the material of the optical devices 200, 300, 400, and 400' is not particularly limited thereto.

The optical devices 200, 300, 400, and 400' may contain a light-dispersing material within a range of approximately 3% to approximately 15%. The light-dispersing material may include, for example, one or more of $SiO_2$, $TiO_2$, and $Al_2O_3$, or another material possessing like properties. When the content of the light-dispersing material is less than about 3%, light may not be sufficiently spread to obtain a light-dispersing effect. In addition, when the content of the light-dispersing material is more than about 15%, the amount of light emitted to the outside through the optical device 200 may be reduced, and thus light extracting efficiency may be decreased.

Figure 10:
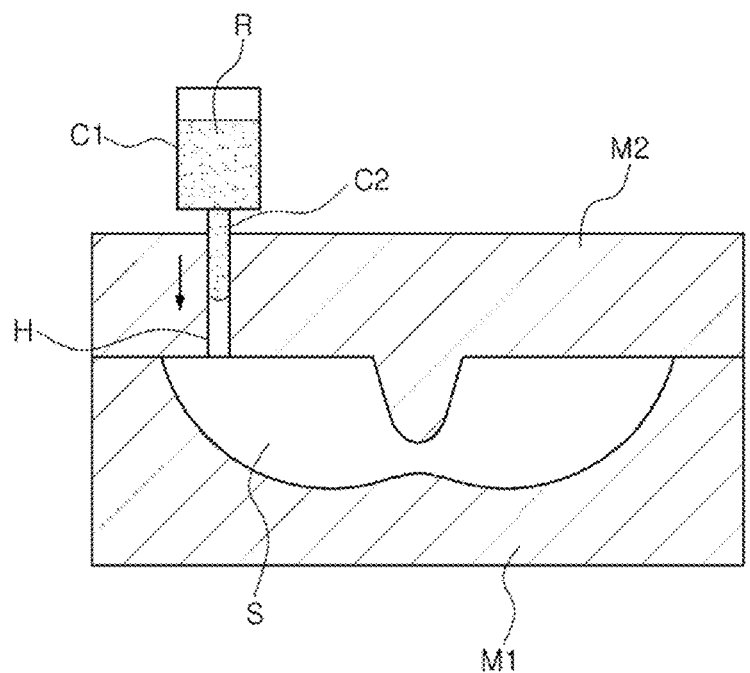
FIG. 10 is a cross-sectional view schematically illustrating a mold used to fabricate an optical device, according to an exemplary embodiment.

FIG. 10 schematically illustrates a method of fabricating an optical device, according to an exemplary embodiment. As illustrated in FIG. 10, the optical device 200 may be formed in such a way that a fluidal solvent R in a container C1 is injected in a hole H of molds M1 and M2 through a tube C2 inserted thereto, and the fluidal solvent R is solidified. For example, a molding process, such as injection molding, transfer molding, compression molding, and the like may be used.

The molds M1 and M2 used for forming the optical device 200 may be formed of, for example, a STAVAX metal, and fabricated by processing using a diamond turning machine (DTM), a cutting machine, or a grinding machine. Thus, a space S having a shape corresponding to the shape of the optical device 200 may be formed in the molds M1 and M2.

Figure 11A:
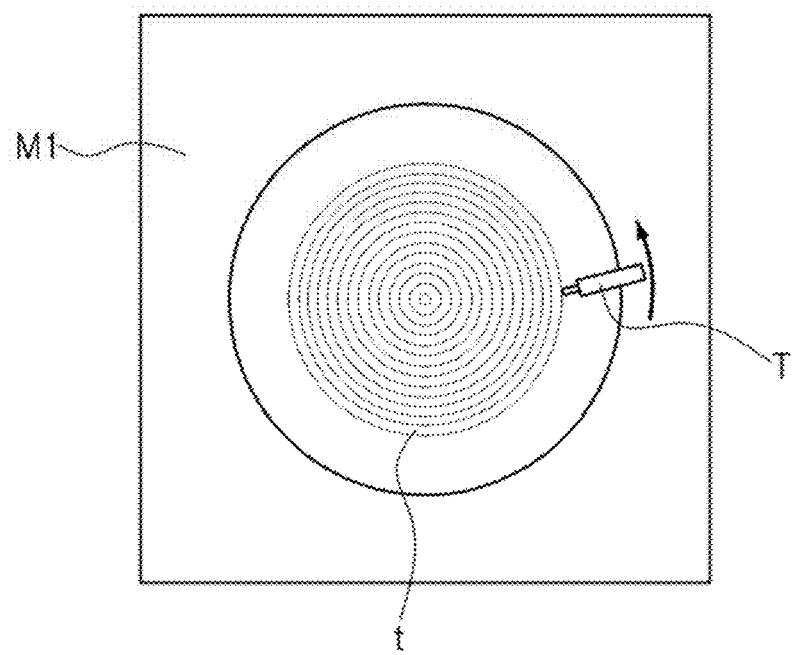
FIGS. 11A and 11B are a plan view and a cross-sectional view schematically illustrating a process of machining the mold illustrated in FIG. 10, according to an exemplary embodiment.
Figure 11B:
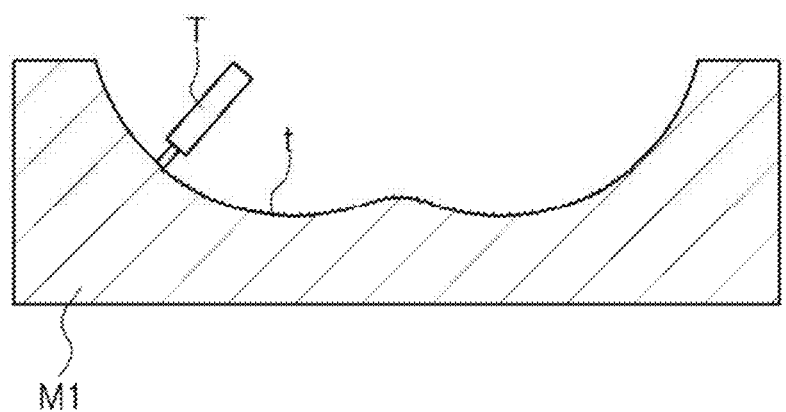

As illustrated in FIGS. 11A and 11B, a tool mark "t" may be formed on a surface of the mold M1 forming the space S by using a tool T used for processing a metal. A plurality of tool marks "t" may create a plurality of rings forming concentric circles around the center of the surface of the space. In addition, the plurality of rings formed by the tool marks "t" may be formed at a regular pitch to form a regular pattern, and may have a structure of being radially enlarged from the center to an edge on the surface of the space. That is, the tool T may be used to form one or more tool marks "t" arranged as a plurality of rings forming on concentric circles around the center of the surface of the space S.

Figure 12A:
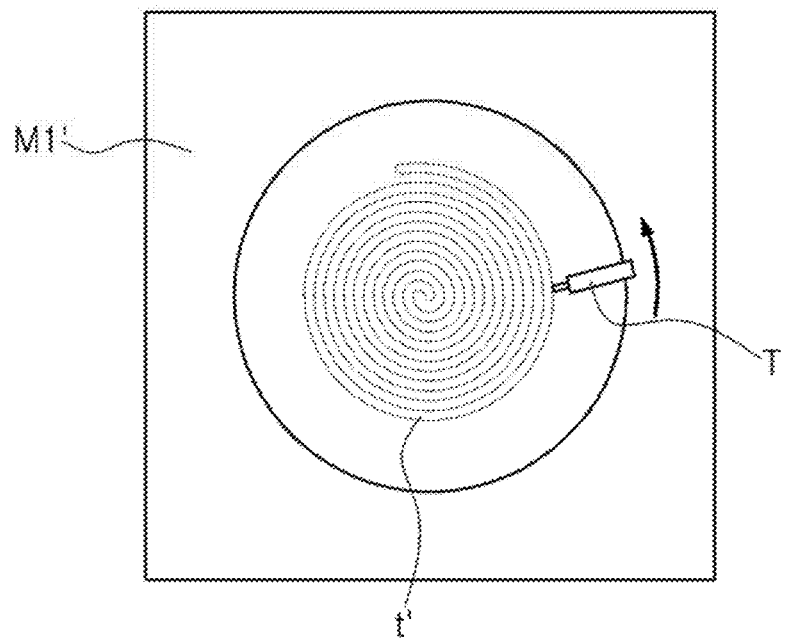
FIGS. 12A and 12B are a plan view and a cross-sectional view schematically illustrating another process of machining the mold illustrated in FIG. 10, according to another exemplary embodiment.
Figure 12B:
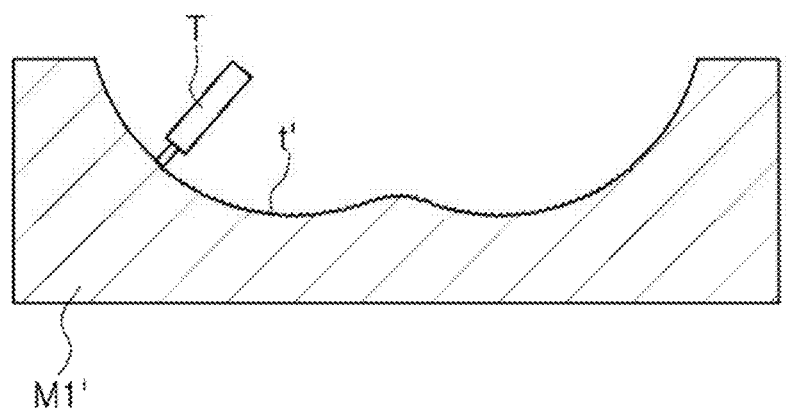

Alternatively, a tool mark t' illustrated in FIGS. 12A and 12B may be formed to have a spiral or coil structure continuously curving from a center to an edge on a surface of a space of a mold M1'. Similarly, the tool mark t' having the spiral or coil structure may be formed such that the rings of the spiral or coil structure are spaced a certain pitch apart to form a certain pattern.

Accordingly, the optical device 200 fabricated by injecting the fluidal solvent R in the space of the molds M1 and M2 and solidifying the fluidal solvent R may have a plurality of ridges 240 corresponding to the tool marks "t" or the tool mark t' on the second surface 202. The plurality of ridges 240 may be formed in various forms and sizes according to the type of the tool T used for processing the surface of the mold M1, and the pitch may also be controlled. Accordingly, the plurality of ridges 240 formed on the second surface 202 of the optical device 200 may be adjusted to meet various conditions by using the tool T used for processing the surface of the mold M1.

Figure 13:
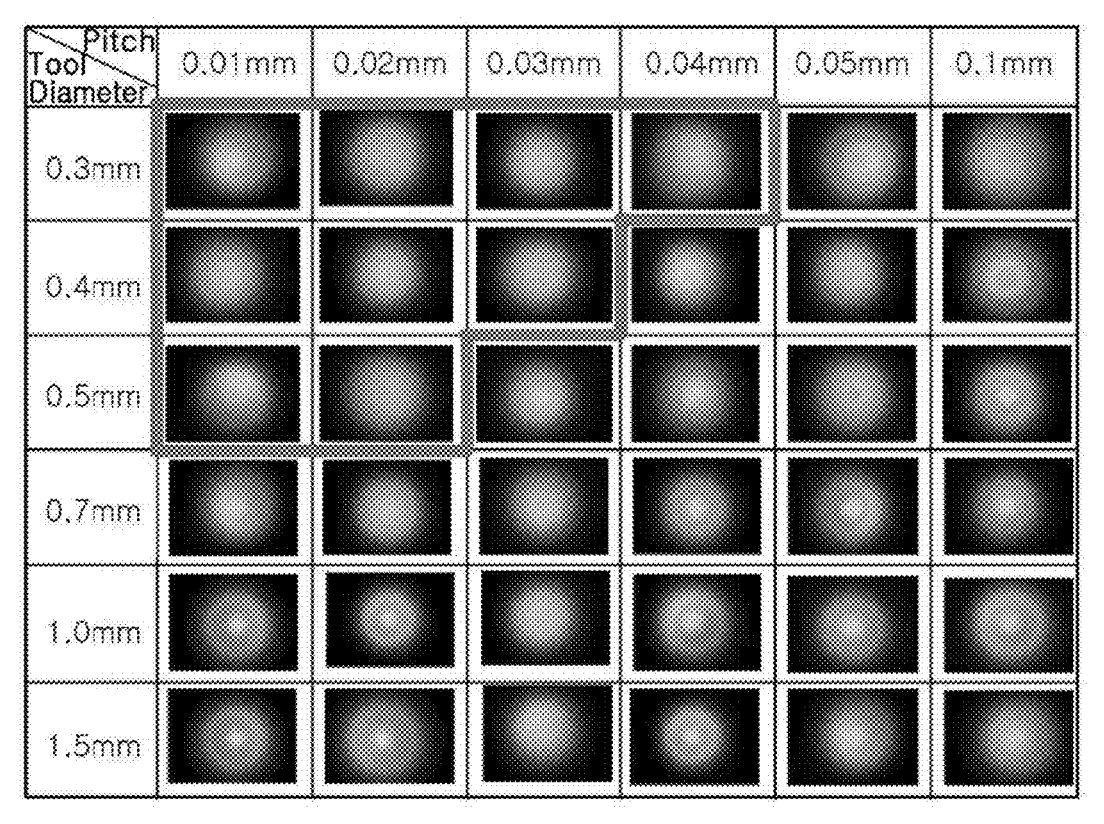

FIG. 13 is a photograph experimentally showing optical characteristics according to a type of a tool T and a processing pitch P. As the tool T, tools having diameters of 0.3 mm, 0.4 mm, 0.5 mm, 0.7 mm, 1.0 mm, and 1.5 mm were used, and molds on which tool marks are formed having pitches of 0.01 mm, 0.02 mm, 0.03 mm, 0.04 mm, 0.05 mm, and 0.1 mm by the tools having respective diameters were prepared. In addition, optical devices were fabricated using those molds, and optical characteristics of each optical device were measured.

As illustrated in FIG. 13, when the pitches are controlled to be within the range of 0.01 mm to 0.04 mm by using tools having the diameter in the range of 0.3 mm to 0.5 mm, the uniformity of light distribution may be increased. More specifically, in the case that the tool having the diameter of 0.3 mm was used, the uniformity of light distribution was increased when the pitch was within the range of 0.01 mm to 0.04 mm. In the case that the tool having the diameter of 0.4 mm was used, the uniformity of light distribution was increased when the pitch was within the range of 0.01 mm to 0.03 mm. In the case that the tool having the diameter of 0.5 mm was used, the uniformity of light distribution was increased when the pitch was within the range of 0.01 mm to 0.02 mm.

The optical device according to the exemplary embodiments features concentric ring-shape patterns or spiral coil-shape patterns periodically formed around the optical axis Z on the light emitting surface. Thus, even when a microscopic difference due to machining errors occurs in the optical device fabricated in the same molds M1 and M2, the difference may be compensated for by the periodic patterns formed on the surface of the optical device. Accordingly, the uniformity of light distribution may be improved.

In particular, such periodic patterns may be formed by conversely using the tool marks "t" or the tool mark t' generated during processing of the mold M1, used for fabricating the optical device. Accordingly, unlike the normal processes in which additional work such as polishing is processed for smoothing the surface of the mold M1, such an additional process may not be needed in the exemplary embodiments. Accordingly, manufacturing processes may become simpler, and manufacturing cost may be reduced and productivity may be improved.

Hereinafter, a light emitting device used in a light source module according to an exemplary embodiment will be described.

Figure 14:
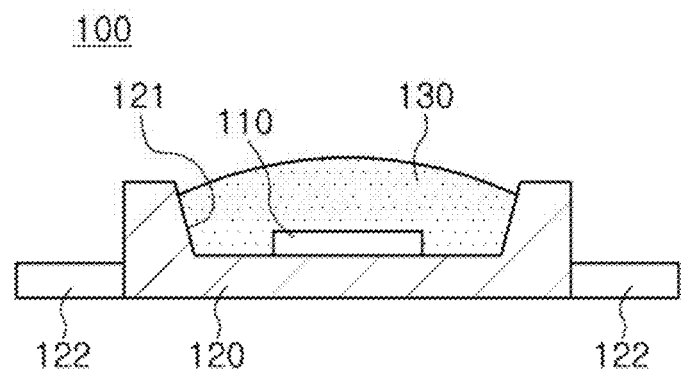
FIGS. 14 and 15 are cross-sectional views illustrating a variety of light emitting devices applicable to a light source module according to an exemplary embodiment.
Figure 15:
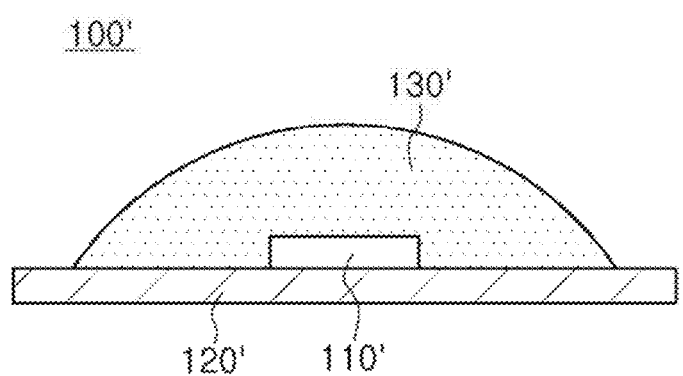

FIGS. 14 and 15 schematically illustrate a light emitting device used in a light source module according to an exemplary embodiment.

As illustrated in FIG. 14, a light emitting device 100 may have a package structure in which an LED chip 110 is installed in a body 120 including a reflective cup 121.

The body 120 may correspond to a base material in which the LED chip 110 is installed and supported, and may be formed of a white molding compound having high light reflectance. The white molding compound may reflect light emitted in the LED chip 110 to increase the amount of light emitted to the outside. Such a white molding compound may include a thermosetting resin group or silicone resin group having high thermal resistance. In addition, a white pigment, a filler, a curing agent, a releasing agent, an antioxidant, and/or an adhesion-improving agent, and the like may be added to a thermoplastic resin group. The body 120 may be formed of FR-4, CEM-3, an epoxy material, or a ceramic material. The body 120 may be formed of a metal material such as Al.

The body 120 may include a lead frame 122 to be electrically connected to an outside power source. The lead frame 122 may be formed of a material having high electric conductivity, for example, a metal material such as Al or Cu, or the like. When the body 120 is formed of a metal material, an insulating material may be interposed between the body 120 and the lead frame 122.

The lead frame 122 may be exposed on a bottom surface of the reflective cup 121 included in the body 120, wherein the LED chip 110 is mounted on the bottom surface of the reflective cup 121. In addition, the LED chip 110 may be electrically connected to the exposed lead frame 122.

A cross-sectional area of the reflective cup 121 exposed on the top surface of the body 120 may be larger than a cross-sectional area of the bottom surface of the reflective cup 121. Here, the cross-sectional area of the reflective cup 121 exposed on the top surface of the body 120 may be defined as a light emitting surface of the light emitting device 100.

The LED chip 110 may be sealed by an encapsulant 130 formed in the reflective cup 121 of the body 120. The encapsulant 130 may contain a wavelength-converting material.

The wavelength-converting material may include, for example, at least one kind of phosphor that is excited by light generated in the LED chip 110 to emit light having a different wavelength. Thus, light having different colors including white light may be emitted.

For example, when the LED chip 110 emits blue light, white light may be emitted by mixing phosphors having yellow, green, and red or orange colors. Otherwise, the LED chip 110 may be configured to include at least one of light emitting devices emitting purple, blue, red, and infrared light. In this case, the LED chip 110 may control color rendering (CRI) in the range from a level of sodium (Na) light (CRI 40) to a level of solar light (CRI 100), and generate a wide variety of levels of white light having a color temperature in the range of about 2000K to about 20000K. In addition, the LED chip 110 may emit visible light having a purple, blue, green, red, or orange color, or infrared light, and may control the color according to an environment or mood. In addition, the LED chip 110 may emit light having a specific wavelength to promote plant growth.

Figure 16:
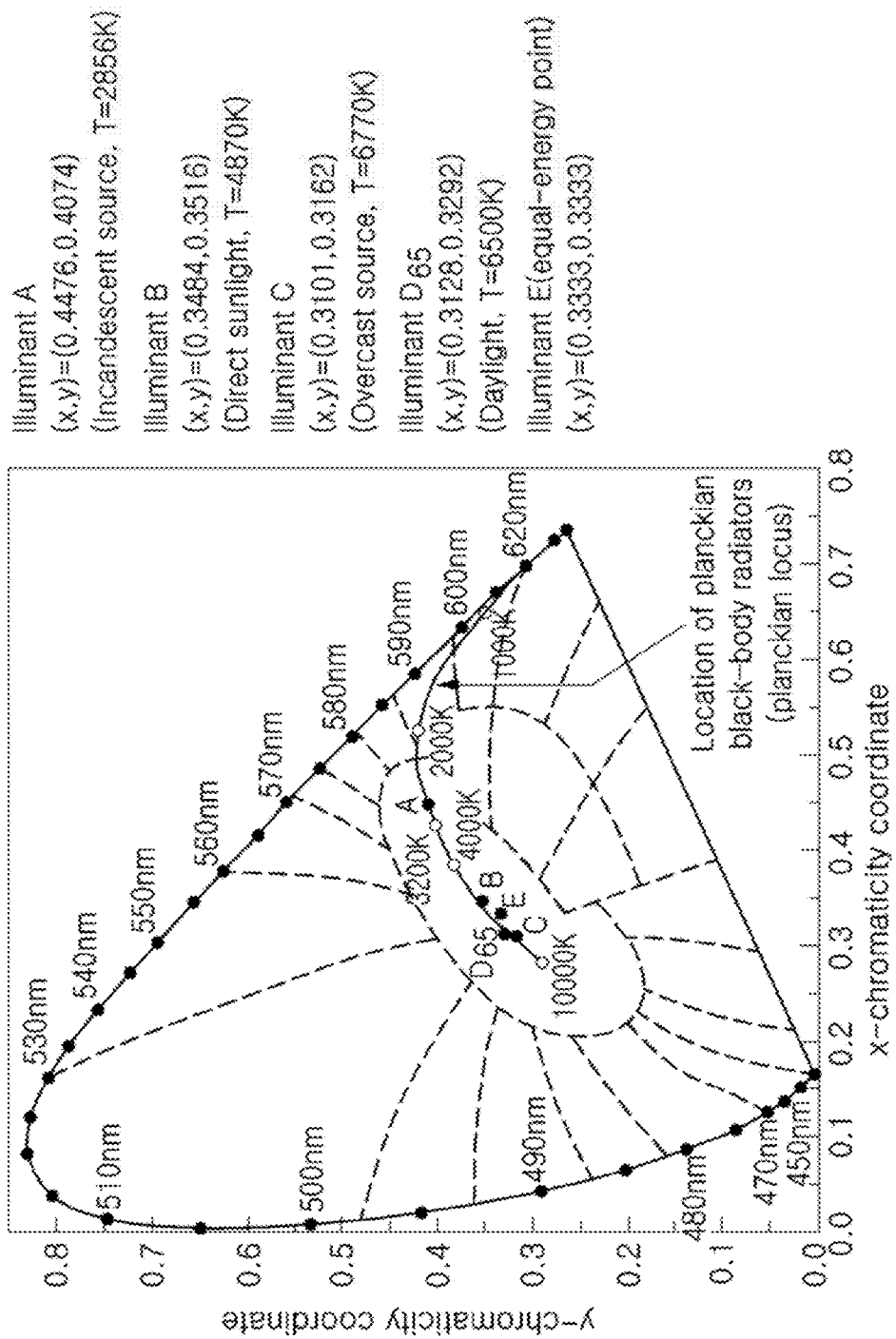
FIG. 16 is the CIE 1931 coordinate system.

White light formed by combination of a blue LED, and yellow, green, and red phosphors and/or green and red LED may have two or more peak wavelengths, and may be located on the line connecting (x, y) coordinates of (0.4476, 0.4074), (0.3484, 0.3516), (0.3101, 0.3162), (0.3128, 0.3292), (0.3333, 0.3333) in the CIE 1931 coordinate system illustrated in FIG. 16. Otherwise, the white light may be located in a zone surrounded by the line and a black body radiation spectrum. The color temperature of the white light may correspond to about 2000K to about 20000K.

The phosphor may have a compositional formula and color as follows.
 *Oxide group: yellow and green $Y_3Al_5O_{12}$:Ce, $Tb_3Al_5O_{12}$:Ce, $Lu_3Al_5O_{12}$:Ce
 *Silicate group: yellow and green $(Ba,Sr)_2SiO_4$:Eu, yellow and orange $(Ba,Sr)_3SiO_5$:Ce
 *Nitride group: green β-SiAlON:Eu, yellow $La_3Si_6N_{11}$:Ce, orange α-SiAlON:Eu, red $CaAlSiN^3$:Eu, $Sr_2Si_5N_8$:Eu, $SrSiAl_4N_7$:Eu
 *Fluoride group: KSF-based red $K_2SiF_6$:Mn4+

The composition of the phosphor may be consistent with stoichiometry, and each element may be substituted by another element in each group of the periodic table. For example, strontium (Sr) may be substituted by Ba, Ca, Mg, and the like in the alkaline earth (II) group, and Y may be substituted by Tb, Lu, Sc, Gd, and the like in the lanthanide group. In addition, Eu, an activator, and the like may be substituted by Ce, Tb, Pr, Er, Yb, and the like according to a desired energy level. The activator may be used alone, or a coactivator may be further included in order to change characteristics.

In addition, a material such as a quantum dot (QD) may be used as an alternative material for the phosphor, or the phosphor and the QD may be used alone or mixed.

The QD may have a structure consisting of a core (3 nm to 10 nm), such as CdSe and InP, a shell (0.5 nm to 2 nm), such as ZnS and ZnSe, and a ligand for stabilizing the shell and core, and implement a variety of colors according to the size.

The following Table 1 illustrates types of phosphors of a white light emitting device including a blue LED chip (440 nm to 460 nm) according to the application field (purpose).

TABLE 1

| Purpose | Phosphors |
| --- | --- |
| LED TV BLU | β-SiAlON:Eu2+ |
|  | (Ca, Sr)AlSiN$_3$:Eu2+ |
|  | La$_3$Si$_6$N$_{11}$:Ce3+ |
|  | K$_2$SiF$_6$:Mn4+ |
| Lighting | Lu$_3$Al$_5$O$_{12}$:Ce3+ |
|  | Ca-α-SiAlON:Eu2+ |
|  | La$_3$Si$_6$N$_{11}$:Ce3+ |
|  | (Ca, Sr)AlSiN$_3$:Eu2+ |
|  | Y$_3$Al$_5$O$_{12}$:Ce3+ |
|  | K$_2$SiF$_6$:Mn4+ |
| Side View (Mobile, Note PC) | Lu$_3$Al$_5$O$_{12}$:Ce3+ |
|  | Ca-α-SiAlON:Eu2+ |
|  | La$_3$Si$_6$N$_{11}$:Ce3+ |
|  | (Ca, Sr)AlSiN$_3$:Eu2+ |
|  | Y$_3$Al$_5$O$_{12}$:Ce3+ |
|  | (Sr, Ba, Ca, Mg)2SiO4:Eu2+ |
|  | K$_2$SiF$_6$:Mn4+ |
| Electric Apparatus (Head Lamp, etc.) | Lu$_3$Al$_5$O$_{12}$:Ce3+ |
|  | Ca-α-SiAlON:Eu2+ |
|  | La$_3$Si$_6$N$_{11}$:Ce3+ |
|  | (Ca, Sr)AlSiN$_3$:Eu2+ |
|  | Y$_3$Al$_5$O$_{12}$:Ce3+ |
|  | K$_2$SiF$_6$:Mn4+ |

In this exemplary embodiment, the light emitting device 100 is described as having a package structure in which the LED chip 110 is included in the body 120 having the reflective cup 121, but the structure is not limited thereto. As illustrated in FIG. 15, a light emitting device 100' may have a chip-on-board (COB) structure in which an LED chip 110' is mounted on an upper surface of a body 120'. In this case, the body 120' may be a circuit board with circuit wirings formed thereon, and the encapsulant 130' may have the structure of a lens protruding on an upper surface of the body 120' and covering the LED chip 110'.

In addition, the light emitting device 100 is described as a single package in this exemplary embodiment, but the structure is not limited thereto. For example, the light emitting device 100 may be the LED chip 110 itself.

Figure 17:
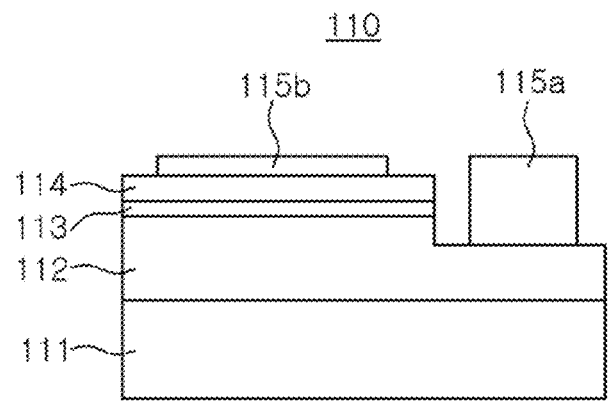
FIGS. 17 to 19 are cross-sectional views illustrating various examples of light emitting diode chips applicable to a light source module according to an exemplary embodiment.
Figure 18:
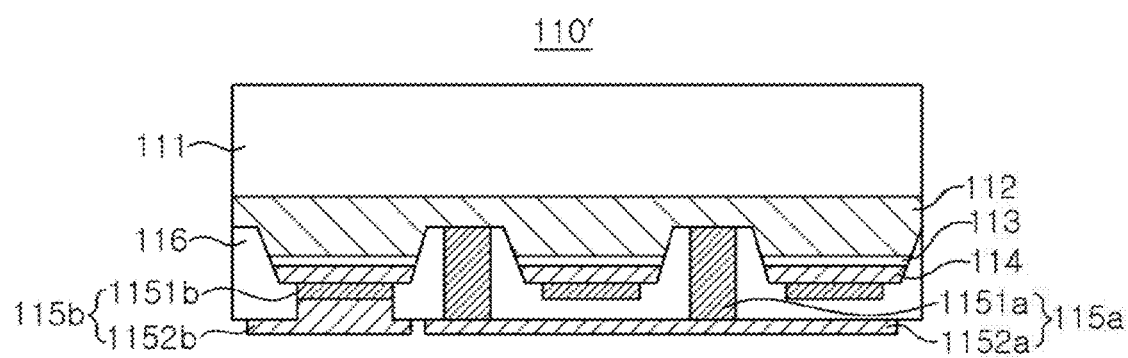
Figure 19:
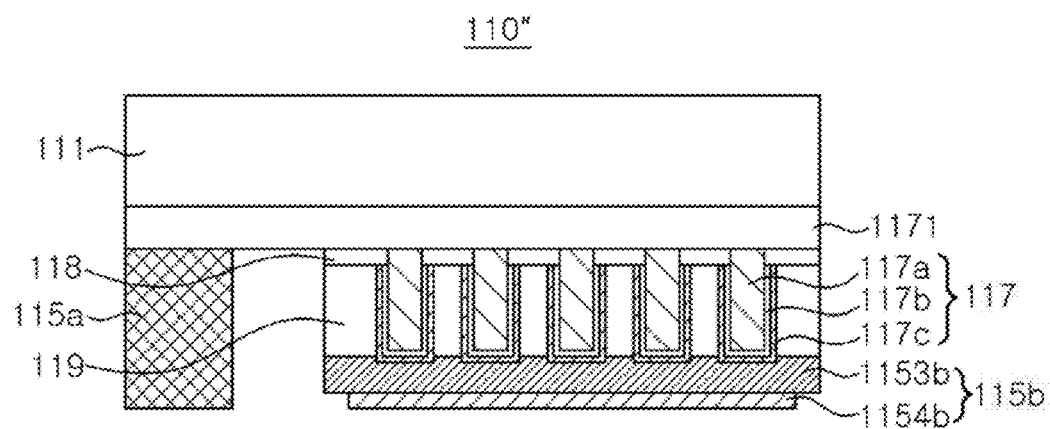

FIGS. 17 to 19 schematically illustrate various examples of LED chips applicable to a light emitting device. FIGS. 17 to 19 are cross-sectional views schematically illustrating various examples of LED chips applicable to a light source module according to exemplary embodiments.

Referring to FIG. 17, an LED chip 110 may include a first conductivity-type semiconductor layer 112, an active layer 113, and a second conductivity-type semiconductor layer 114 which are sequentially stacked on a growth substrate 111.

The first conductivity-type semiconductor layer 112 stacked on the growth substrate 111 may be an n-type nitride semiconductor layer doped with n-type impurities. In addition, the second conductivity-type semiconductor layer 114 may be a p-type nitride semiconductor layer doped with p-type impurities. However, the positions of the first conductivity-type semiconductor layer 112 and the second conductivity type semiconductor layer 114 may be exchanged in some exemplary embodiments. The first conductivity type semiconductor layer 112 and the second conductivity type semiconductor layer 114 may have a compositional formula of $Al_xIn_yGa_{(1-x-y)}N$ (wherein, $0 \leq x < 1$, $0 \leq y < 1$, and $0 \leq x+y < 1$), and may be, for example, GaN, AlGaN, InGaN, and AlInGaN.

The active layer 113 interposed between the first conductivity type semiconductor layer 112 and the second conductivity type semiconductor layer 114 may emit light having a level of energy generated by electron-hole recombination. The level may be predetermined. The active layer 113 may include a material having a smaller energy bandgap than the first conductivity type semiconductor layer 112 and the second conductivity type semiconductor layer 114. For example, when the first conductivity type semiconductor layer 112 and the second conductivity type semiconductor layer 114 are formed of a GaN-based compound semiconductor, the active layer 113 may include an InGaN-based compound semiconductor having a smaller energy bandgap than GaN. Further, the active layer 113 may have a multi-quantum well (MQW) structure, for example, an InGaN/GaN structure, in which a quantum well layer and a quantum barrier layer are alternately stacked. However, the structure of the active layer 113 is not limited thereto, and the active layer 113 may, for example, have a single quantum well (SQW) structure.

The LED chip 110 may include a first electrode pad 115*a* and a second electrode pad 115*b* electrically connected to the first conductivity type semiconductor layer 112 and the second conductivity type semiconductor layer 114, respectively. The first electrode pad 115*a* and the second electrode pad 115*b* may be exposed and disposed in the same direction. In addition, the first electrode pad 115*a* and the second electrode pad 115*b* may be electrically connected to a substrate by a wire bonding method or a flip-chip bonding method.

An LED chip 110' illustrated in FIG. 18 may include a semiconductor stacked body formed on the growth substrate 111. The semiconductor stacked body may include a first conductivity-type semiconductor layer 112, an active layer 113, and a second conductivity-type semiconductor layer 114.

The LED chip 110' may include a first electrode pad 115*a* and a second electrode pad 115*b* respectively connected to the first conductivity type semiconductor layer 112 and the second conductivity type semiconductor layer 114. The first electrode pad 115*a* may include a conductive via 1151*a* passing through the second conductivity-type semiconductor layer 114 and the active layer 113 to be connected to the first conductivity-type semiconductor layer 112, and an electrode extension portion 1152*a* connected to the conductive via 1151*a*. The conductive via 1151*a* may be surrounded by an insulating layer 116 so as to be electrically separated from the active layer 113 and the second conductivity-type semiconductor layer 114. The conductive via 1151*a* may be disposed in an area where the semiconductor stacked body is etched. The number, shape, and/or pitch of the conductive via 1151*a*, and/or a contact area with the first conductivity-type semiconductor layer 112 may be appropriately formed to reduce contact resistance. In addition, the conductive via 1151*a* may be a plurality of conductive vias 1151*a* arranged in rows and columns on the semiconductor stacked body to improve current flow. The second electrode pad 115*b* may include an ohmic contact layer 1151*b* and an electrode extension portion 1152*b* on the second conductivity-type semiconductor layer 114.

An LED chip 110" illustrated in FIG. 19 may include a growth substrate 111, a first conductivity-type semiconductor base layer 1171 formed on the growth substrate 111, and a plurality of light-emitting nanostructures 117 formed on the first conductivity-type semiconductor base layer 1171. In addition, the LED chip 110" may further include an insulating layer 118 and a filling portion 119.

Each of the plurality of light-emitting nanostructures 117 may include a first conductivity-type semiconductor core 117*a*, and an active layer 117*b* and a second conductivity-type semiconductor layer 117*c* sequentially formed as shell layers on a surface of the first conductivity-type semiconductor core 117*a*.

In the exemplary embodiment of FIG. 19, each of the light-emitting nanostructures 117 is illustrated as having a core-shell structure. However, the structure of the light-emitting nanostructure 117 is not limited thereto, and the light-emitting nanostructure 117 may have a different structure, for example, a pyramidal structure. The first conductivity-type semiconductor base layer 1171 may provide a growth surface for the light-emitting nanostructures 117. The insulating layer 118 may provide an open area for the growth of the light-emitting nanostructures 117, and may be formed of an insulating material, such as $SiO_2$ or $SiN_x$. The filling portion 119 may structurally stabilize the light-emitting nanostructures 117, and may function to transmit or reflect light. When the filling portion 119 includes a light-transmitting material, the filling portion 119 may be formed of a transparent material, such as $SiO_2$, SiNx, an elastic resin, silicone, an epoxy resin, a polymer, or plastic. When the filling portion 119 includes a reflective material, the filling portion 119 may be formed of a polymer material such as polyphthalamide (PPA), and high reflective metal powder or ceramic powder. The high reflective ceramic powder may be one or more of $TiO_2$, $Al_2O_3$, $Nb_2O_5$, $Al_2O_3$, and ZnO, or the like. Otherwise, the high reflective metal may be aluminum (Al) or silver (Ag).

A first electrode pad 115*a* and A second electrode pad 115*b* may be disposed on a bottom surface of the light-emitting nanostructures 117. The first electrode pad 115*a* may be disposed on an exposed surface of the first conductivity-type semiconductor base layer 1171, and the second electrode pad 115*b* may include an ohmic contact layer 1153*b* and an electrode extension portion 1154*b* formed under the light-emitting nanostructures 117 and the filling portion 119. The ohmic contact layer 1153*b* and the electrode extension portion 1154*b* may be integrally formed.

Figure 20:
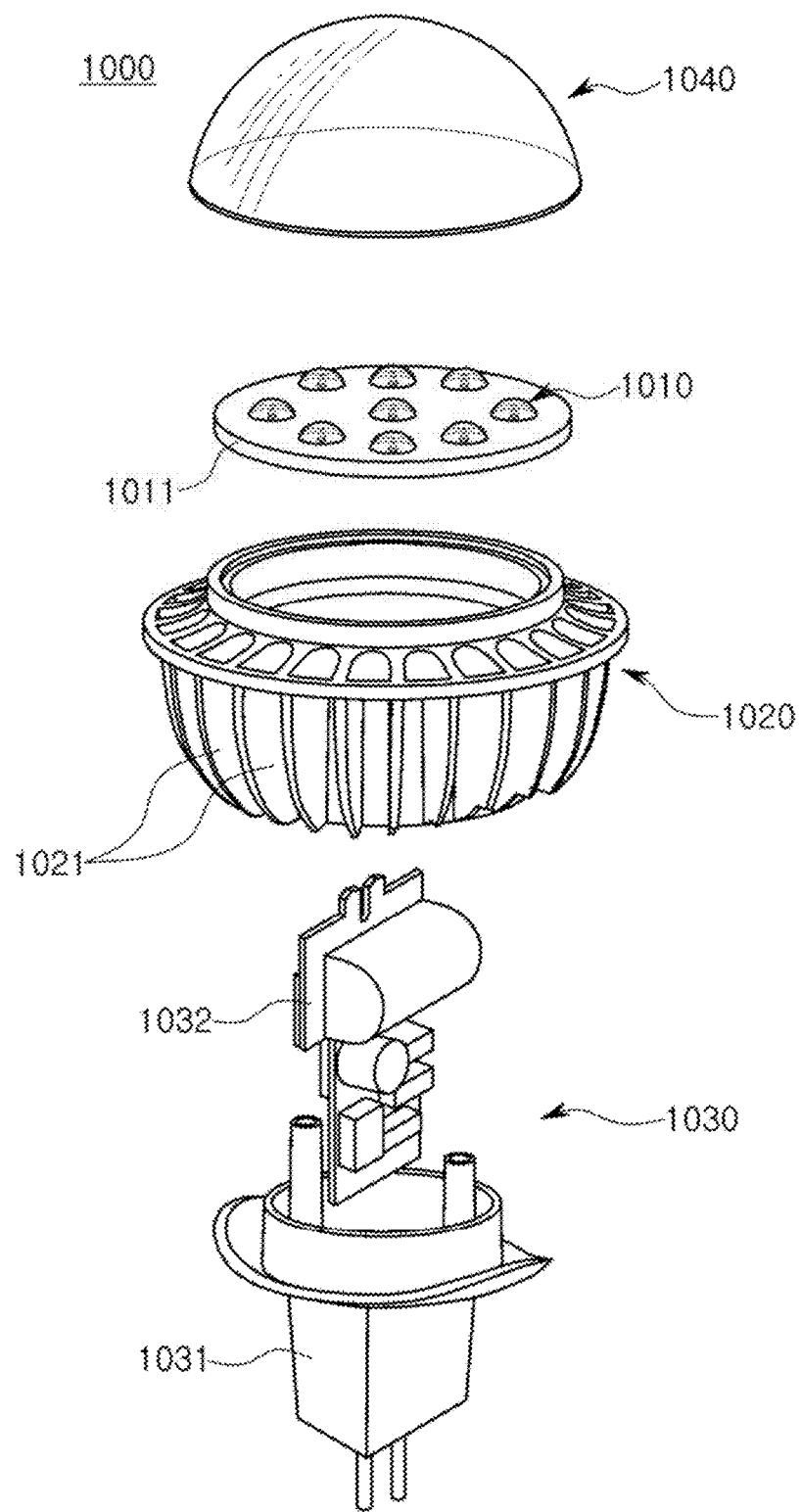
FIG. 20 is an exploded perspective view schematically illustrating a lighting device (a bulb type) according to an exemplary embodiment.

FIG. 20 schematically illustrates a lighting device according to an exemplary embodiment.

Referring to FIG. 20, a lighting device 1000 may be a bulb-type lamp, and may be used as an indoor lighting device, for example, a downlight. The lighting device 1000 may include a housing 1020 having an electrical connection structure 1030, and at least one light source module 1010 mounted on the housing 1020. In addition, the lighting device 1000 may further include a cover 1040 mounted on the housing 1020 and covering the at least one light source module 1010.

Since the light source module 1010 may be substantially the same as the light source module described with reference to FIGS. 1 to 9, detailed descriptions thereof will be omitted. A plurality of light source modules 1010 may be mounted on a circuit substrate 1011. The number of the light source modules 1010 may be variously controlled.

The housing 1020 may function as a frame supporting the light source module 1010, and a heat sink emitting heat generated in the light source module 1010 to the outside. For this, the housing 1020 may be formed of a rigid material having a high thermal conductivity, for example, a metal material such as Al, a heat-dissipating resin, or the like.

A plurality of heat-dissipating fins 1021 that increase a contact area with air to improve a heat-dissipating efficiency may be formed on an outer side surface of the housing 1020.

An electrical connection structure 1030 electrically connected to the light source module 1010 may be formed on the housing 1020. The electrical connection structure 1030 may include a terminal 1031, and a driver 1032 supplying driving power received through the terminal 1031 to the light source module 1010.

The terminal 1031 may permit the lighting device 1000 to be installed in a socket, for example, to be fixed and electrically connected. In this exemplary embodiment, the terminal 1031 is described as having a sliding pin-type structure, but the structure is not limited thereto. For example, the terminal 1031 may have an Edison-type structure installed by turning a screw thread.

The driver 1032 may function to convert external driving power into an appropriate current source for driving the light source module and supply the converted current source. The driver 1032 may be comprised of, for example, an AC-DC converter, parts for a rectifier circuit, a fuse, or the like. In addition, the driver 1032 may further include a communication module implementing a remote control function, as needed.

The cover 1040 may be installed in the housing 1020 to cover the at least one light source module 1010, and may have a convex lens shape or a bulb shape. The cover 1040 may be formed of a light-transmitting material, and include a light-spreading material.

Figure 21:
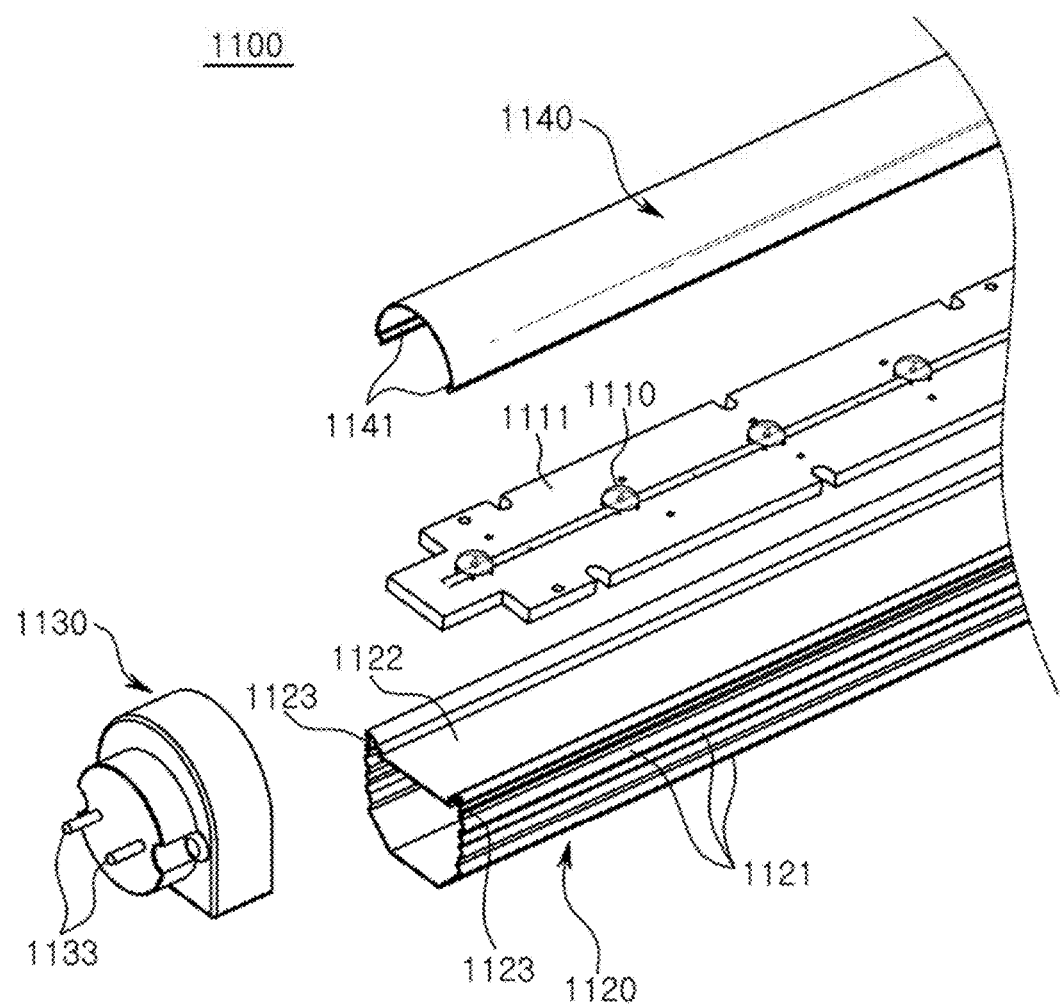
FIG. 21 is an exploded perspective view schematically illustrating a lighting device (an L-lamp type) according to an exemplary embodiment.

FIG. 21 is an exploded perspective view schematically illustrating a lighting device according to another exemplary embodiment. Referring to FIG. 21, a lighting device 1100 may be, for example, a bar-type lamp, and may include a light source module 1110, a housing 1120, a terminal 1130, and a cover 1140.

The light source module 1110 may include the light source module described in FIGS. 1 to 9. Accordingly, detailed descriptions thereof will be omitted. A plurality of light source modules 1110 may be mounted on a circuit board 1111, and the number of light source modules 1110 mounted on the circuit board 1111 may be controlled.

The housing 1120 may mount and fix the light source module 1110 on one surface 1122 thereof, and release heat generated in the light source module 1110 to the outside. For this, the housing 1120 may be formed of a material having a high thermal conductivity, for example, a metal material, and a plurality of heat dissipating fins 1121 may be formed to protrude on both side surfaces thereof.

A plurality of light source modules 1110 may be installed on the one surface 1122 of the housing 1120 in a state of being mounted and arranged on the circuit board 1111.

The cover 1140 may be fastened to a fastening groove 1123 of the housing 1120 to cover the light source module 1110. In addition, the cover 1140 may have a semi-circularly curved surface so that light generated in the light source module 1110 is uniformly emitted to the outside overall. An overhanging 1141 engaged with the fastening groove 1123 of the housing 1120 may be formed in a longitudinal direction in a bottom of the cover 1140.

The terminal 1130 may be disposed at at least one open end of two end portions of the housing 1120 in the longitudinal direction to supply power to the light source module 1110. The terminal 1130 may further include at least one electrode pin 1133 protruding outside.

Figure 22:
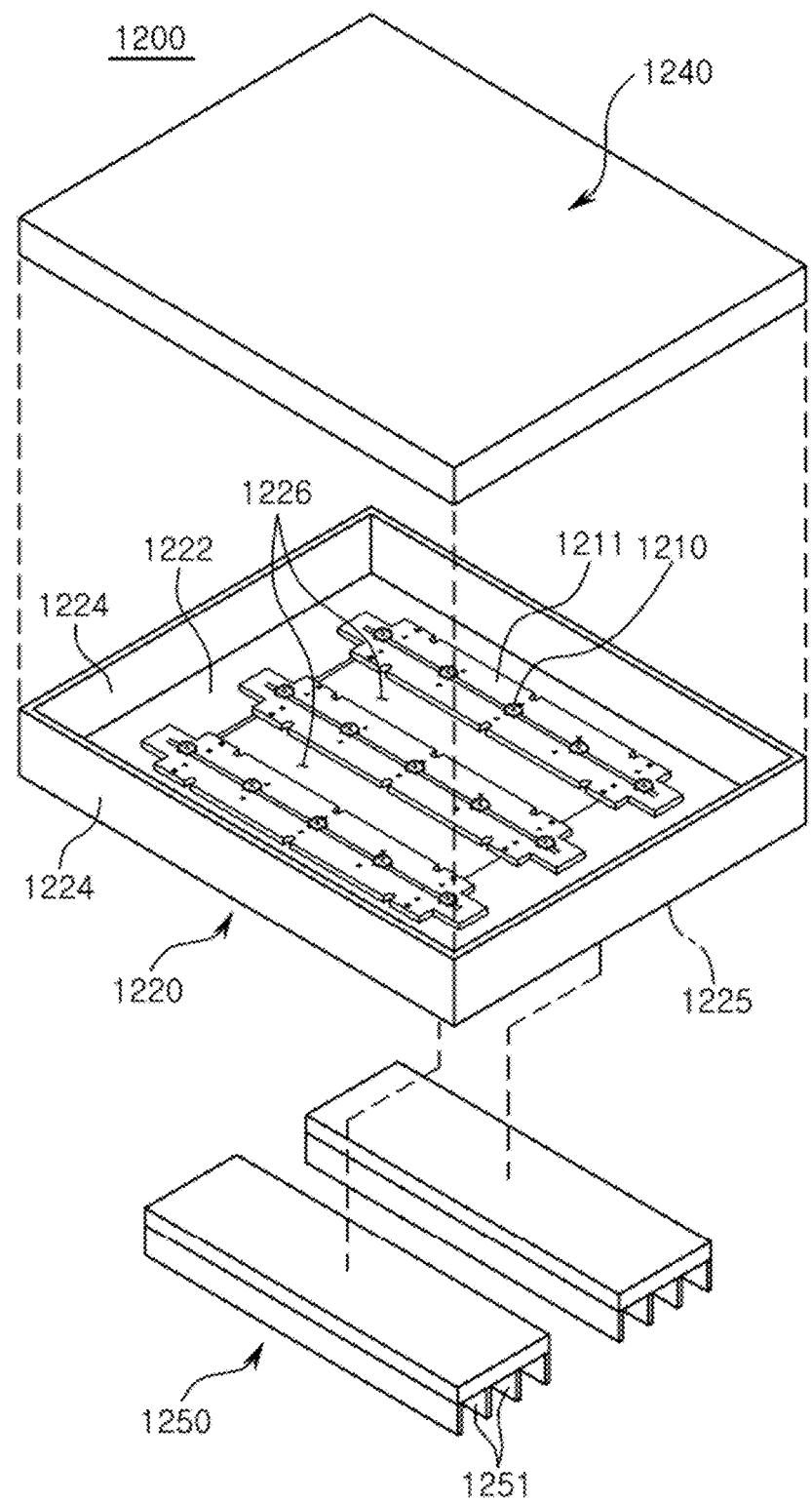
FIG. 22 is an explosive perspective view schematically illustrating a lighting device (a plate type) according to an exemplary embodiment.

FIG. 22 is an exploded perspective view schematically illustrating a lighting device according to another exemplary embodiment. Referring to FIG. 22, a lighting device 1200 may have, for example, a surface light source type structure, and include a light source module 1210, a housing 1220, a cover 1240, and a heat sink 1250.

The light source module 1210 may include the light source module described with reference to FIGS. 1 to 9. Accordingly, detailed descriptions thereof will be omitted. A plurality of light source modules 1210 may be mounted on a circuit board 1211. Additionally, a plurality of circuit boards 1211 may be provided.

The housing 1220 may have a box-type structure including one surface 1222 on which the light source module 1210 is mounted, and a side surface 1224 extending from edges of the one surface 1222. The housing 1220 may be formed of a material having high thermal conductivity, for example, a metal material, so as to release heat generated in the light source module 1210 to the outside.

At least one hole 1226 to which the heat sink 1250, which will be described later, is to be inserted and engaged may be formed to pass through the one surface 1222 of the housing 1220. In addition, the circuit board 1211 on which the light source module 1210 installed on the one surface 1222 is mounted may be partly engaged on the hole 1226 to be exposed to the outside.

The cover 1240 may be fastened to the housing 1220 to cover the light source module 1210. In addition, the cover 1240 may have a flat structure overall.

The heat sink 1250 may be engaged to the at least one hole 1226 through the other surface 1225 of the housing 1220. In addition, the heat sink 1250 may be in contact with the light source module 1210 through the at least one hole 1226 to release heat generated in the light source module 1210 to the outside. In order to increase heat dissipating efficiency, the heat sink 1250 may include a plurality of heat dissipating fins 1251. The heat sink 1250, like the housing 1220, may be formed of a material having high thermal conductivity.

Lighting devices using the light emitting device may be roughly divided into indoor lighting devices and outdoor lighting devices according to its purpose. The indoor LED lighting devices may be bulb-type lamps, fluorescent lamps (LED-tubes), or flat-type lighting devices, etc. and may, for example, be used for retrofitting existing lighting devices. The outdoor LED lighting device may be street lights, guard lamps, floodlights, viewing lights, or traffic lights, etc.

In addition, the LED lighting device may be utilized as interior or exterior light sources for a vehicle. As the interior light source, the LED lighting device may be used as various light sources for a vehicle interior lights, reading lamps, and/or instrument panels, etc. As the exterior light source, the LED lighting device may be used as all kinds of light sources, such as headlights, brake lights, turn indicators, fog lights, and running lights. Further, the LED lighting device may be used as a light source for robots or various types of mechanical equipment. In particular, an LED lighting device using a specific wavelength band may promote the growth of plants, or stabilize mood of a person or cure diseases as an emotional lighting device.

A lighting system including the above-described lighting device will be described with reference to FIGS. 23 to 26. A lighting system 2000 according to an exemplary embodiment may automatically control a color temperature according to an environment (for example, a temperature and/or a humidity of the environment) and provide not a simple lighting device but an emotional lighting device which meets the sensitivity of a human being.

Figure 23:
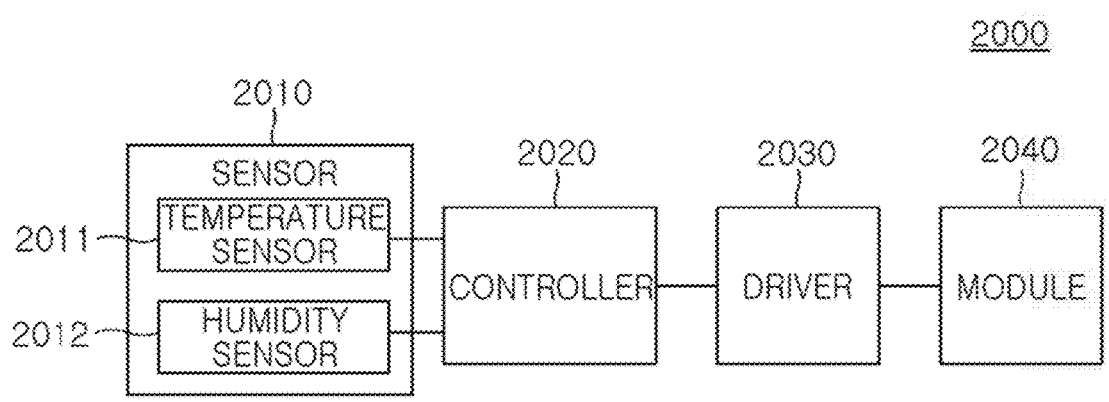
FIG. 23 is a block diagram schematically illustrating a lighting system according to an exemplary embodiment.

FIG. 23 is a block diagram schematically illustrating a lighting system according to an exemplary embodiment.

Referring to FIG. 23, the lighting system 2000 may include a sensor 2010, a controller 2020, a driver 2030, and a lighting module 2040.

The sensor 2010 may be installed indoors or outdoors, and include a temperature sensor 2011 and humidity sensor 2012 to measure at least one air condition among temperature and humidity of an environment. In addition, the sensor 2010 may send the measured air condition, that is, temperature and humidity to the controller 2020 electrically connected thereto.

The controller 2020 may compare the measured air temperature and humidity with air conditions (ranges of temperature and humidity) preset by users, and then determine a color temperature of the lighting module 2040 corresponding to the air condition, based on a comparison result. The controller 2020 may be electrically connected to the driver 2030, and control the driver 2030 to drive the lighting module 2040 to be at the determined color temperature.

Figure 24:
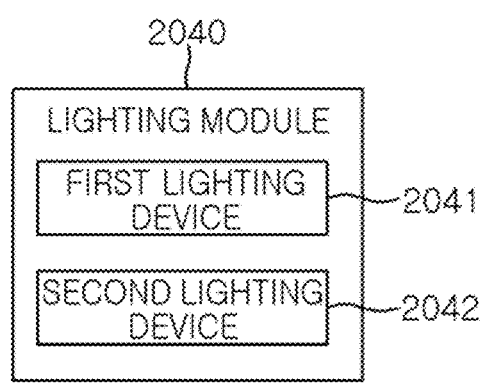
FIG. 24 is a block diagram schematically illustrating a detailed configuration of lighting module of the lighting system illustrated in FIG. 23.

The lighting module 2040 may be operated according to power supplied by the driver 2030. The lighting module 2040 may include at least one lighting device illustrated in FIGS. 20 to 22. For example, the lighting module 2040 may include, as illustrated in FIG. 24, a first lighting device 2041 and a second lighting device 2042, having different respective color temperatures, and each of the lighting devices 2041 and 2042 may include a plurality of light emitting devices emitting the same white light.

The first lighting device 2041 may emit white light with a first color temperature, and the second lighting device 2042 may emit white light with a second color temperature. The first color temperature may be lower than the second color temperature. Alternatively, the first color temperature may be higher than the second color temperature. Here, a white color with a relatively low temperature may correspond to a warm white color, and a white color with a relatively high temperature may correspond to a cold white color. When power is supplied to the first lighting device 2041 and the second lighting device 2042, relative white color lights with first and second color temperatures may be emitted, and the relative white lights may be mixed to implement white light having the color temperature determined by the controller 2020.

More specifically, in the case that the first color temperature is lower than the second color temperature, when the color temperature determined by the controller 2020 is relatively high, the mixed white light may be implemented to have the determined color temperature by decreasing the light emission amount of the first lighting device 2041 and increasing the light emission amount of the second lighting device 2042. Alternatively, when the color temperature determined by the controller 2020 is relatively low, the mixed white light may be implemented to have the determined color temperature by increasing the light emission amount of the first lighting device 2041 and decreasing the light emission amount of the second lighting device 2042. Here, each light emission amount of the first lighting device 2041 and the second lighting device 2042 may be implemented by adjusting the light emission amount by adjusting power, or by adjusting the number of driven light emitting devices.

Figure 25:
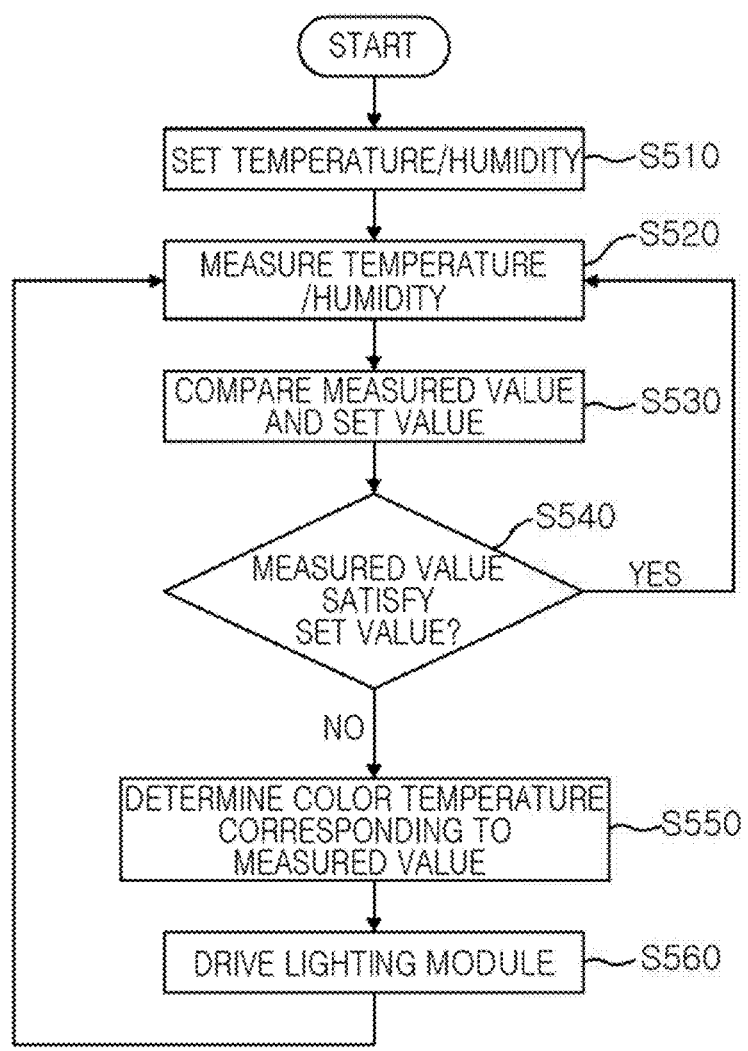
FIG. 25 is a flowchart for describing a method of controlling the lighting system illustrated in FIG. 23.

FIG. 25 is a flowchart for describing a method of controlling the lighting system illustrated in FIG. 23, according to an exemplary embodiment. Referring to FIG. 25, first, a color temperature is set according to ranges of a temperature and a humidity using the controller 2020 (S510). The color temperature may be set by a user, or may be received by a signal from the outside. The set temperature and humidity data may be stored in the controller 2020.

Normally, a cool feeling color may be produced when the color temperature is about 6000K or more, and a warm feeling color may be produced when the color temperature is about 4000K or less. According to the exemplary embodiment, when the temperature and humidity are respectively higher than 20° C. and 60%, the lighting module 2040 may be set to be lit at a color temperature of 6000K or more, and when the temperature and humidity are respectively in the range of 10 to 20° C. and 40 to 60%, the lighting module 2040 may be set to be lit at a color temperature of 4000 to 6000K or more. Further, when the temperature and humidity are respectively lower than 10° C. and 40%, the lighting module 2040 may be set to be lit at a color temperature of 4000K or less.

Next, the sensor 2010 may measure at least one condition of a temperature and a humidity of an environment (S520). The temperature and humidity measured in the sensor 2010 may be sent to the controller 2020.

Next, the controller 2020 may compare the measured values received from the sensor 2010 with set values (S530). Here, the measured value is temperature and humidity data measured at the sensor 2010, and the set values are temperature and humidity data preset and stored at the controller 2020. The set values may be preset and stored at the controller 2020 by the user. That is, the controller 2020 may compare the measured temperature and humidity with the preset temperature and humidity.

As a result of the comparison, the controller 2020 may determine if the measured values are within the range of set values or not (S540). When the measured values are within the range of the set values (S540, YES), the current color temperature is maintained, and the temperature and humidity are measured again (S520). On the contrary, when the measured values are not within the range of the set values (S540, NO), set values corresponding to the measured values are detected, and a color temperature corresponding thereto may be determined (S550). In addition, the controller 2020 may control the driver 2030 to drive the lighting module 2040 to be at the determined color temperature.

Then, the driver 2030 may drive the lighting module 2040 to be at the determined color temperature (S560). That is, the driver 2030 may supply power for driving the determined color temperature to the lighting module 2040. Thus, the lighting module 2040 may be at a color temperature corresponding to the temperature and humidity preset by the user according to the temperature and humidity of the environment.

Thus, the lighting system may automatically control a color temperature of an interior lighting module according to the change of a temperature and a humidity of an environment, meet the sensitivity of human being changing according to the change of a natural environment, and provide mental stability.

Figure 26:
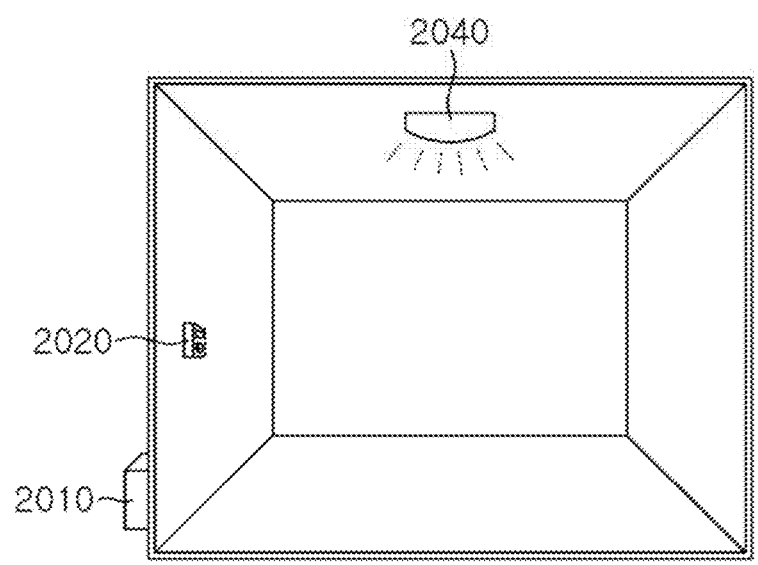
FIG. 26 is an exemplary view of use in which the lighting system illustrated in FIG. 23 is schematically implemented.

FIG. 26 is an exemplary view of use in which the lighting system illustrated in FIG. 23 is schematically implemented, according to an exemplary embodiment. As illustrated in FIG. 26, a lighting module 2040 may be installed on a ceiling as an indoor lighting. Here, a sensor 2010 may be implemented as a separate individual device and installed on an outer wall in order to measure a temperature and humidity of outside air. In addition, a controller 2020 may be installed indoors in order to facilitate setting and checking by a user. However, the lighting system according to the exemplary embodiment is not limited thereto, and the lighting system may be installed on a wall instead of an interior lighting, and applicable to any lighting used in both indoor and outdoor, such as a lamp.

Optical designs of the above-described lighting devices using LEDs may change depending on the product type, location, and purpose. For example, with respect to the above-described emotional lighting, there is a technique for controlling the lighting by wireless (remote) control using a mobile apparatus such as a smart-phone, in addition to technique for controlling the color, temperature, and brightness of the lighting.

In addition, there is a visible-light wireless communication technology in which the original purpose of an LED light source and additional communication purpose can be achieved at the same time by adding a communication function to the LED lighting devices and display apparatuses. This is because the LED light source has longer lifespan than other light sources in the field, has excellent power efficiency, and implements a variety of colors. Further, the LED light source has advantages in which a switching speed for digital communication is high, and digital control is available.

The visible-light wireless communication technology is a technology for wirelessly transmitting information using light in a visible-light wavelength band, which can be perceived by the human eye. Such visible-light wireless communication technology is distinct from wire communication technology and infrared-light wireless communication technology because the visible-light wireless communication technology uses light in a visible-light wavelength band. Further, the visible-light wireless communication technology is distinct from the wire communication technology because the visible-light wireless communication technology uses a wireless communication environment.

In addition, differently from radio frequency (RF) wireless communication, the visible-light wireless communication technology has convenience in using frequencies because the visible-light wireless communication technology can be freely used without restrictions or authorization, is physically secure, and has a difference in that users can visually confirm a communication link. Most of all, the visible-light wireless communication technology has a feature as fusion technology in which the original purpose of a light source and communication functions can be achieved at the same time.

According to the exemplary embodiments in the present disclosure, a light source module, a lighting device, and a lighting system capable of preventing occurrence of mura defects and having uniform light distribution may be provided.

While certain exemplary embodiments have been shown and described above, it will be apparent to those skilled in the art that modifications and variations could be made without departing from the scope of the present disclosure as defined by the appended claims.

What is claimed is:

1. A light source module comprising:
 a light emitting device configured to emit light in a light emitting direction; and
 an optical device comprising a first surface disposed over the light emitting device and having a groove recessed in the light emitting direction in a central portion through which an optical axis of the optical device passes, and a second surface disposed opposite to the first surface and configured to refract light incident through the groove to be emitted to the outside,
 wherein the optical device comprises a plurality of ridges disposed on the second surface and periodically arranged in a direction from the optical axis to an edge of the optical device connected to the first surface.

2. The light source module of claim 1, wherein the plurality of ridges are arranged in concentric circles around the optical axis.

3. The light source module of claim 1, wherein the plurality of ridges are arranged in spirals around the optical axis.

4. The light source module of claim 1, wherein a pitch of the plurality of ridges is about 0.01 mm to about 0.04 mm.

5. The light source module of claim 1, wherein the second surface convexly protrudes in the light emitting direction, and has an inflection point at which a central area through which the optical axis passes is concavely recessed toward the groove.

6. The light source module of claim 1, wherein the second surface has a concave portion having a concavely curved surface recessed toward the groove along the optical axis, and a convex portion having a convexly curved surface extending continuously from an edge of the concave portion to the edge of the optical device.

7. The light source module of claim 1, wherein the groove is disposed to face the light emitting device above the light emitting device.

8. The light source module of claim 1, wherein the groove has a cross-sectional area exposed on the first surface that is larger than a cross-sectional area of a light emitting surface of the light emitting device.

9. The light source module of claim 1, wherein the optical device is disposed above the light emitting surface such that the first surface faces the light emitting device and is located on a same plane as an upper surface of the light emitting device.

10. The light source module of claim 1, wherein the first surface further comprises a reflection groove configured to re-reflect light, that is totally reflected by the second surface and directed back toward the first surface, among light emitted from the light emitting device, and emit the re-reflected light to the outside through the second surface.

11. The light source module of claim 10, wherein the reflection groove is formed in a ring between the groove of the central area and an edge of the first surface and forms a rotational symmetry with respect to the optical axis Z.

12. The light source module of claim 10, wherein the reflection groove has a peak that is located at a position lower than a peak of the groove in the light emitting direction, and the reflection groove includes an inclined surface connecting the peak to the first surface, and a reflective surface connecting the peak to the edge of the optical device.

13. The light source module of claim 12, wherein the reflective surface has a gently curved surface.

14. The light source module of claim 1, wherein the first surface further comprises a support configured to support the optical device.

15. A lighting device comprising:
 a housing having an electrical connection structure; and
 at least one of light source module mounted on the housing and electrically connected to the electrical connection structure, wherein the at least one light source module comprises:
a light emitting device configured to emit light in a light emitting direction; and
an optical device comprising a first surface disposed over the light emitting device and having a groove recessed in the light emitting direction in a central portion through which an optical axis of the optical device passes, and a second surface disposed opposite to the first surface and configured to refract light incident through the groove to be emitted to the outside,
wherein the optical device comprises a plurality of ridges disposed on the second surface and periodically arranged in a direction from the optical axis to an edge of the optical device connected to the first surface.

16. The lighting device of claim 15, further comprising a cover mounted on the housing and configured to cover the at least one light source module.

17. A lighting system comprising:
a sensor configured to measure at least one of a temperature and a humidity of an environment;
a controller configured to compare the at least one of the temperature and the humidity measured by the sensor with a set value;
a lighting module comprising at least one lighting device; and
a driver that supplies power to the sensor, the controller, and the lighting module,
wherein the controller is further configured to determine a color temperature of the lighting module based on a result of the comparison, and control the lighting module based on the color temperature.

18. The lighting system of claim 17, wherein the at least one lighting device comprises a housing having an electrical connection structure, and at least one light source module mounted on the housing, and
the at least one light source module comprises:
a light emitting device configured to emit light in a light emitting direction; and
an optical device comprising a first surface disposed over the light emitting device and having a groove recessed in the light emitting direction in a central portion through which an optical axis of the optical device passes, and a second surface disposed opposite to the first surface and configured to refract light incident through the groove to be emitted to the outside,
wherein the optical device comprises a plurality of ridges disposed on the second surface and periodically arranged in a direction from the optical axis to an edge connected to the first surface.

19. The lighting system of claim 18, wherein the plurality of ridges are arranged to form respective concentric circles around the optical axis.

20. The lighting system of claim 17, wherein the at least one lighting device comprises a first lighting device configured to emit a first light having a first color temperature, and a second lighting device configured to emit a second light having a second color temperature, and
wherein the controller is further configured to control the first lighting device and the second lighting device to mix the first light and the second light to generate light having the determined color temperature based on the first color temperature and the second color temperature.

* * * * *